United States Patent
Toyosawa et al.

(10) Patent No.: US 6,650,002 B1
(45) Date of Patent: *Nov. 18, 2003

(54) SEMICONDUCTOR DEVICE HAVING ACTIVE ELEMENT CONNECTED TO AN ELECTRODE METAL PAD VIA A BARRIER METAL LAYER AND INTERLAYER INSULATING FILM

(75) Inventors: Kenji Toyosawa, Ikoma (JP); Atsushi Ono, Yamatokoriyama (JP); Yasunori Chikawa, Kitakatsuragi-gun (JP); Nobuhisa Sakaguchi, Tenri (JP); Nakae Nakamura, Fukuyama (JP); Yukinori Nakata, Kasaoka (JP)

(73) Assignee: Sharp Kabushiki Kaishi, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/598,168

(22) Filed: Jun. 21, 2000

Related U.S. Application Data

(62) Division of application No. 09/064,165, filed on Apr. 22, 1998, now Pat. No. 6,441,467.

(30) Foreign Application Priority Data

Apr. 24, 1997 (JP) .............................................. 9-107843
Apr. 22, 1998 (JP) ........................................... 10-111781

(51) Int. Cl.$^7$ .......................... H01L 23/58; H01L 23/48

(52) U.S. Cl. ........................ 257/637; 257/640; 257/641; 257/644; 257/758; 257/760

(58) Field of Search .................................. 257/635, 637, 257/638, 639, 640, 641, 644, 649, 650, 779, 780, 781, 782, 783, 784; 438/724, 744, 757, 791, 954, 723

(56) References Cited

U.S. PATENT DOCUMENTS 5,110,763 A * 5/1992 Matsumoto .................. 438/624

(List continued on next page.)

FOREIGN PATENT DOCUMENTS

JP         57-87145 A       5/1982

(List continued on next page.)

OTHER PUBLICATIONS

Japanese Official Action and Translation of Notice of Reasons for Refusal for Japanese Patent Application No. 10–111781, mailed Jun. 17, 2003.

*Primary Examiner*—Steven Loke
*Assistant Examiner*—Hung Kim Vu
(74) *Attorney, Agent, or Firm*—Nixon & Vanderhye P.C.

(57) ABSTRACT

A semiconductor device of the present invention has (1) an active element provided on a semiconductor substrate, (2) an interlayer insulating film formed so as to cover the active element, (3) a pad metal for an electrode pad which is provided on the interlayer insulating film, (4) a barrier metal layer which is provided on the active element with the interlayer insulating film therebetween, so that the pad metal is i formed on the barrier metal layer, and (5) an insulating layer having high adherence to the barrier metal layer, the insulating layer being provided between the interlayer insulating film and the barrier metal layer. With this arrangement, the adherence between the barrier metal layer, the insulating film and the interlayer insulating film is surely improved, even in the case where an external force is applied to the electrode pad upon bonding or after bonding, the barrier metal layer hardly comes off the part thereunder. Therefore, the breakdown of a level difference compensating film, and the exfoliation of the barrier metal layer from the interlayer insulating film can be prevented, while the semiconductor device of the area pad structure featuring lower costs, high quality, and high liability is constantly mass-produced. Besides, the yield of the semiconductor device is surely improved.

16 Claims, 23 Drawing Sheets

U.S. PATENT DOCUMENTS

| | | | |
|---|---|---|---|
| 5,306,936 A | * 4/1994 | Goto | 257/640 |
| 5,420,070 A | * 5/1995 | Matsuura et al. | 438/625 |
| 5,856,707 A | * 1/1999 | Sardella | 257/758 |
| 5,904,556 A | * 5/1999 | Suzuki et al. | 438/623 |
| 5,907,788 A | * 5/1999 | Kasai | 438/622 |

FOREIGN PATENT DOCUMENTS

| | | |
|---|---|---|
| JP | 58-086733 | 5/1983 |
| JP | 58-192350 | 11/1983 |
| JP | 62-154768 | 7/1987 |
| JP | 63-025952 | 2/1988 |
| JP | 63-104449 | 5/1988 |
| JP | 1-91439 A | 4/1989 |
| JP | 03-127843 | 5/1991 |
| JP | 3-283622 | 12/1991 |
| JP | 5-6915 A | 1/1993 |
| JP | 05-121570 | 5/1993 |
| JP | 5-175196 A | 7/1993 |
| JP | 5-198527 A | 8/1993 |
| JP | 6-112265 | * 4/1994 |
| JP | 06-204283 | 7/1994 |
| JP | 07-130789 | 5/1995 |
| JP | 8-23008 A | 1/1996 |
| JP | 09-027589 | 1/1997 |

* cited by examiner

SEMICONDUCTOR DEVICE HAVING ACTIVE ELEMENT CONNECTED TO AN ELECTRODE METAL PAD VIA A BARRIER METAL LAYER AND INTERLAYER INSULATING FILM

This is a division of application Ser. No. 09/064,165, filed Apr. 22, 1998, now U.S Pat. No. 6,441,467, the entire content of which is hereby incorporated by reference in this application.

FIELD OF THE INVENTION

The present invention relates to a semiconductor integrated circuit device (hereinafter simply referred to as semiconductor device) for use in, for example, a liquid crystal driver or the like, and more particularly, relates to an electrode pad structure of a semiconductor device.

BACKGROUND OF THE INVENTION

Conventionally, semiconductor chips (semiconductor devices) featuring a double metal structure have been mass-produced, and most of the semiconductor chips of this type are arranged so that each includes an electrode pad 70 in an area other than a circuit element area therein, as shown in FIG. 19.

More specifically, for example, a silicon oxide film (hereinafter referred to as CVD-silicon oxide film) 55 formed by the low-pressure chemical vapor, deposition (CVD) method and a boron phospho-silicate glass (BPSG) film 56 are laminated on a silicon substrate 51 in this order. On the BPSG film 56, a barrier metal layer 58 and a first metal layer 59 are provided in this order as wiring materials.

The first metal layer 59 is made of aluminum or aluminum alloy containing silicon or copper siliside. However, in the case where aluminum or aluminum-alloy wires are solely provided, the liability of the device is impaired by halation occurring in a photo resist process, stress migration due to thermal stress, or the like. Therefore, in the case where it is formed to a thickness of 1 μm or less, the first metal layer 59 is deposited on the barrier metal layer 58 made of a refractory metal such as titanium, tungsten, or titanium-tungsten, or silicide of such refractory metal, or a refractory metal oxinitride.

On the first metal layer 59, an interlayer insulating film 60 which is generally composed of a first interlayer insulating film 60a, a second interlayer insulating film 60b, a third interlayer insulating film 60c. The first interlayer insulating film 60a and the third interlayer insulating film 60c are films made of a silicon compound, such as silicon oxide-films or silicon nitride films. The second interlayer insulating film 60b is formed by the spin-on-glass (SOG) method with which unevenness caused as a result of depositing the first metal layer 59 are eliminated, so that a flat surface is obtained.

A second metal layer 64 is provided on the first metal layer 59 w a barrier metal layer 63 therebetween, in a through hole formed in the interlayer insulating film 60. In other words, in the through hole, the interlayer insulating film 60 for insulation does not exist between the first metal layer 59 and the second metal layer 64.

On the interlayer insulating film 60 and the second metal layer 64, there is provided a passivation film 65 (65a and 65b) made of phospho-silicate glass (PSG) or silicon nitride. According to the bonding method such as the inner lead bonding (ILB) method, as shown in FIG. 19, a barrier metal layer 66 made of a refractory metal such as titanium-tungsten is formed on the passivation film 65 (65a and 65b) and on the second metal layer 64, and further, a gold bump 67 is formed on the barrier metal layer 66.

Incidentally, a semiconductor chip which is formed by providing an electrode pad 70 on an active element 50 of an electric circuit as shown in FIG. 20, i.e., by "the area pad technique", is recently mass-produced. By this technique whereby the electrode pad 70 is formed on the active element 50, a portion below the pad which has not been utilized is now effectively utilized, thereby allowing reduction of the size of the chip. Besides, the electrode pad 70 is provided in any area of the chip, whereby the freedom degree relating to the design of the semiconductor chip is raised. The following description will explain the wafer manufacturing process of the semiconductor chip of this type, while referring to FIGS. 20 and 21(a) through 21(d).

First, as shown in FIG. 21(a), a silicon oxide film 52 is formed on a silicon substrate 51, and a polysilicon film 53 as a conductive layer is formed on the silicon oxide film 52, so that the polysilicon film 53 constitutes a gate electrode. Then, as shown in FIG. 21(b), diffusion layers 54a and 54b are formed in the silicon substrate 51, and thereafter, a CVD-silicon oxide film 55 is formed by the low-pressure CVD method.

Subsequently, as shown in FIG. 21(c), a BPSG film 56 is formed at a normal pressure on the CVD-silicon oxide film 55, and then, the CVD-silicon oxide film 55 and the PBSG film 56 are photo-etched, so that contact holes 57a and 57b are formed. Thereafter, by the sputtering method, barrier metal layers 58a and 58b made of titanium-tungsten or the like, first metal layers 59a and 59b for metal wiring, which are made of aluminum or aluminum alloy such as aluminum-silicon, aluminum-copper-silicon, or the like. Then, dry-etching is conducted with respect to the barrier metal layers 58a and 58b, and the first metal layers 59a and 59b, to obtain wires f desirably arranged.

Next, as shown in FIG. 21(d), (1) a first interlayer insulating layer 60a composed of a silicon oxide film, a silicon nitride film, or the like, (2) a second interlayer insulating film 60b composed of a film formed by the SOG method (hereinafter referred to as an SOG film) or the like, and (3) a third interlayer insulating film 60c composed of a silicon oxide film, a silicon nitride film, or the like, are laminated in this order on the PBSG film 56 and the first metal layer 59a and 59b, so that an inter-layer insulating film 60 having a trilaminar structure is formed.

The reason why the second interlayer insulating film 60b is provided between the first interlayer insulating film 60a and the third interlayer insulating film 60c, whereby these three layers constitutes the interlayer insulating film 60, is that gas such as steam from, for example, the SOG film as the second interlayer insulating film 60b, upon heat application thereto in the manufacturing process, would be prevented from intruding into the upper and lower layers. In the case where the silicon oxide films or the silicon nitride films are not provided so as to sandwich the SOG film, the gas may cause leakage (this phenomenon is hereinafter referred to as leakage defect).

Note that, to block the gas generated from the SOG film, the silicon nitride film which has a gas blocking property superior to that of the silicon oxide film is preferably used. However, if the SOG film is provided between the silicon nitride films, the interlayer insulating film 60 might be swollen due to gas pressure in some cases, and in the worst case, the interlayer insulating film 60 cannot be formed.

Subsequently, after forming a through hole in the interlayer insulating film 60 as shown in FIG. 20, a barrier metal layer 63 made of titanium-tungsten and a second metal layer 64 made of aluminum or an aluminum alloy are formed thereon as a pad metal and a wire, respectively.

Thereafter, the passivation film 65 (65a and 65b) made of PSG or silicon nitride is formed at a predetermined position on the second metal layer 64 in a manner such that the passivation film 65 may not be damaged upon bonding. Here, as shown in a plan view of in FIG. 22, an opening is formed in the passivation film 65 (65a and 65b) so that an edge 65c of the opening (hereinafter referred to as an opening edge 65c) is positioned at a distance of 2.5 μm to 10 μm toward inside from an edge 64a of the second metal layer 64. In the case where gold wires or aluminum alloy wires are bonded to the second metal layer as the pad metal by the wire bonding method, the process ends with this step, and the semiconductor chip wafer is completed.

On the other hand, in the case where the ILB method is used as the bonding method, a barrier metal layer 66 made of a refractory metal such as titanium or titanium tungsten is deposited or the second metal layer 64 and the passivation film 65 (6a and 65b) by the sputtering method, and thereafter, the gold bump 67 is formed by the electric plating method. Then, an inner lead 68 (see FIG. 23) is bonded to the gold bump 67.

However, in the case of a semiconductor chip of the conventional area pad structure, if the wire bonding or the inner lead bonding is conducted under excessive conditions or if an external force is applied thereto after the bonding, a portion under the electrode pad 70 may be damaged and broken as shown in FIG. 23, and the barrier metal layer 63 may peel off the third interlayer insulating film 60c. As a result, the electrode 70 comes off (open defect), whereby a serious problem in quality such as the breaking of a wire (wire breaking defect) occurs.

The causes of this problem are: (1) the second interlayer insulating film 60b composed of a mechanically fragile thing such as an SOG film exists under the electrode pad 70; and (2) the third interlayer insulating film 60c made of PSG or BPSG, and the barrier metal layer 63 made of a refractory metal such as titanium-tungsten do not have adherence to each other.

Thus, in the conventional semiconductor chip arrangement, drawbacks such as breakdown of the portion under the pad upon bonding or exfoliation of the pad cannot be sufficiently prevented. Therefore, a semiconductor device hating a structure such that occurrence of such drawbacks is prevented is now demanded.

SUMMARY OF THE INVENTION

The object of the present invention is to provide a semiconductor device of an area pad structure with which breakdown of a part under a pad and exfoliation of the pad can be avoided.

A semiconductor device of the present invention is characterized in comprising (1) an active element provided on a semiconductor substrate, (2) an interlayer insulating film formed so as to cover the active element, (3) a pad metal for an electrode pad, the pad metal being provided on the interlayer insulating film, (4) a barrier metal layer provided on the active element with the interlayer insulating film therebetween, so that the pad metal is provided on the barrier metal layer, and (5) an insulating film having high adherence to the barrier metal layer, the insulating film being provided between the interlayer insulating film and the barrier metal layer.

According to the above arrangement, to form a semiconductor device by providing an interlayer insulating film and a barrier metal layer on an active element on a semiconductor substrate, an insulating film having high adherence to the barrier metal layer is provided between the barrier metal layer and the interlayer insulating film. Therefore, the adherence between the barrier metal layer, the insulating film, and the interlayer insulating film is surely enhanced. As a result, in the case, for example, an external force is applied to the electrode pad upon bonding with respect to the same, the barrier metal layer does not come off the part thereunder.

Therefore, with the aforementioned arrangement, the breaking of a wire (wire breaking defect) due to the exfoliation of the barrier metal layer can be avoided. As a result, the semiconductor device of the area pad structure wherein the electrode pad is formed on the active element is constantly mass-produced, whereby the semiconductor device comes to feature lower costs, high quality, and high liability. Besides, since the exfoliation the barrier metal layer is avoided, the yield of the semiconductor device of the area pad structure is surely improved.

To achieve the above object, another semiconductor device of the present invention is characterized in comprising (1) an active element having a metal wire, the active element being provided on a semiconductor substrate, (2) an interlayer insulating film formed so as to cover the active element, (3) a pad metal for an electrode pad, the pad metal being provided above the interlayer insulating film, and (4) a barrier metal layer provided on the active element with the interlayer insulating film therebetween, so that the pad metal is provided on the barrier metal layer, wherein (i) the interlayer insulating film has at least a level difference compensating film for compensating a level difference of the metal wire, and (ii) only a portion of the level difference compensating film under the pad metal is removed.

According to the foregoing arrangement, in providing the barrier metal layer on the active element on the semiconductor substrate, with the interlayer insulating film provided therebetween, the interlayer insulating film having the level difference compensating film which is mechanically fragile, only a portion under the pad metal is completely removed, from the level difference compensating film which is easily broken by the stress upon bonding. Therefore, the level difference of the metal wire is not compensated, but the breakdown of the level difference compensating film does not occur under the pad metal.

Accordingly, with the above arrangement, the exfoliation of the barrier metal layer from the part thereunder due to the breakdown of the level difference compensating film can be avoided. By doing so, the semiconductor device of the area pad structure wherein the electrode pad is formed on the active element is constantly mass-produced, whereby the semiconductor device comes to feature lower costs, high quality, and high liability. Besides, since the exfoliation the barrier metal layer is avoided, the yield of the semiconductor device of the area pad structure is surely improved. Note that the level difference compensating film may be formed to a minimum thickness necessary for compensating the level difference.

A semiconductor device, having the same arrangement as the aforementioned, may be arranged so as to have a passivation film which is formed so as to cover a large part of the pad metal.

According to the foregoing arrangement, the passivation film which is usually formed so as to partially cover the pad metal is formed so as to largely cover the pad metal. By doing so, in the case where stress is applied to a part under the pad metal due to shock or stress upon bonding or after bonding, thereby causing the barrier metal layer to peel off the part thereunder, the barrier metal layer is held by the passivation film. As a result, exfoliation of the barrier-metal layer scarcely occurs. Accordingly, by thus providing the passivation film, possibility of the exfoliation of the barrier metal layer from the part thereunder is surely decreased.

For a fuller understanding of the nature and advantages of the invention, reference should be made to the Ensuing detailed description taken in conjunction with the accompanying drawings.

DESCRIPTION OF THE PREFERRED EMBODIMENTS

First Embodiment

Figure 1:
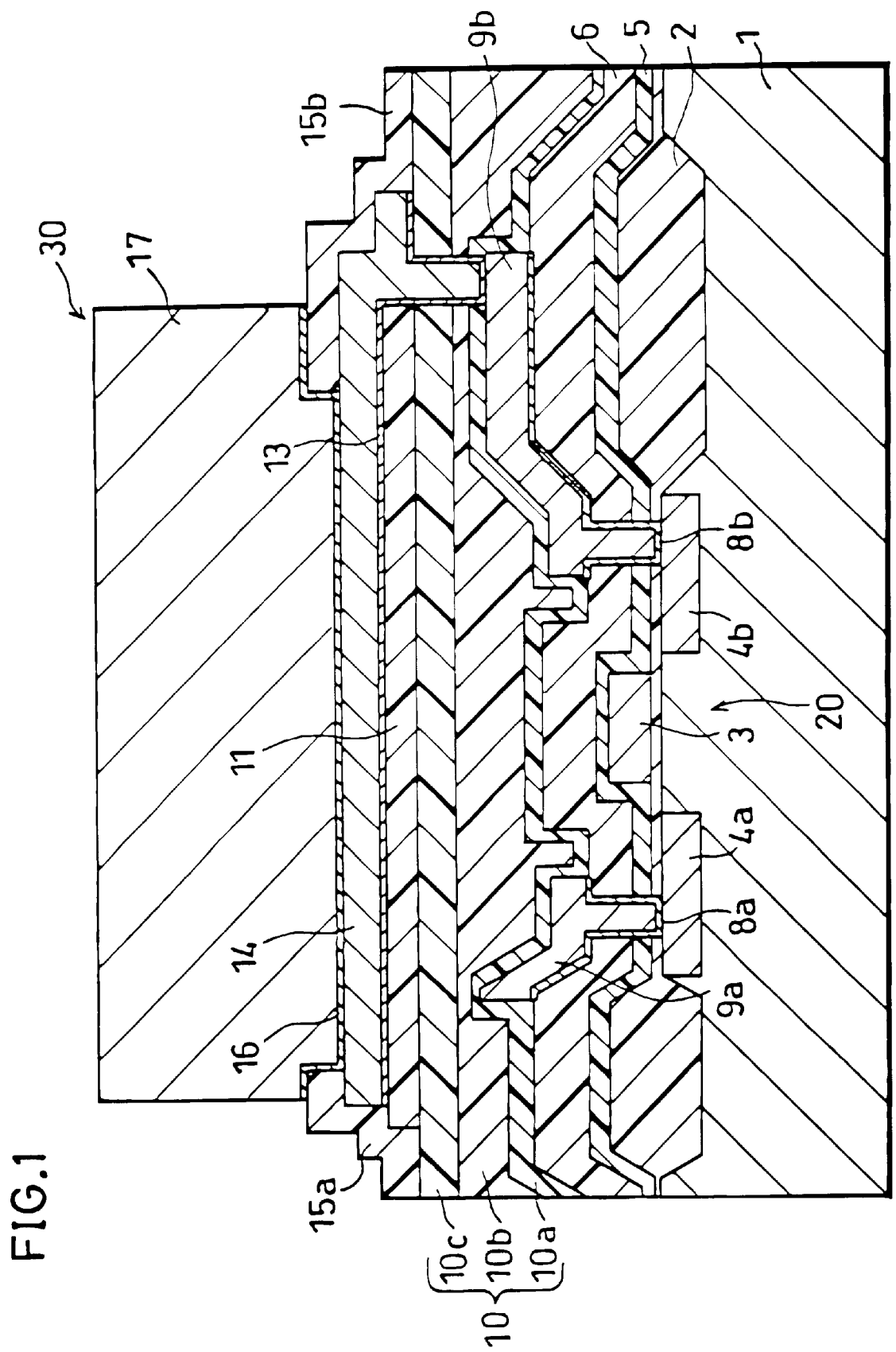
FIG. 1 is a cross-sectional view illustrating an arrangement of a semiconductor device in accordance with an embodiment the present invention.

The following description will explain an embodiment of the present invention, while referring to the drawings.

A semiconductor chip (semiconductor device) of the present embodiment is arranged, as shown in FIG. 1, so that a silicon oxide film 2 is formed on a silicon substrate 1 (semiconductor substrate) including diffusion layers 4a and 4b, and a polysilicon film 3 as a conductive layer serving as a gate electrode is formed on the silicon oxide film 2.

On the silicon oxide film 2 and the polysilicon film 3, a CVD-silicon oxide film 5 formed by the low pressure CVD method, and a BPSG film 6 are laminated in this order. In the CVD-silicon oxide film 5 and the BPSG film 6, contact holes are formed. Then, barrier metal layers 8a and 8b made of titanium-tungsten or the like, and first metal layers 9a and 9b as metal wires made of aluminum or aluminum alloy such as aluminum silicon or aluminum copper silicon, are formed in and around the contact holes. Thus, an active element 20 is formed.

Besides, on the BPSG film 6 and the first metal layers 9a and 9b, an interlayer insulating film 10 is formed. The interlayer insulating film 10 is a trilaminar insulating film composed of a first interlayer insulating film 10a, a second interlayer insulating film 10b, and a third interlayer insulating film 10c which are laminated in this order.

The first interlayer insulating film 10a and the third interlayer insulating film 10c are films containing silicon, such as silicon oxide films, silicon nitride films, or films made of TEOS (tetra ethoxy silane), PSG (phospho-silicate glass), SPSG (boron phospho-silicate glass), NSG (non-dope silicate glass), or the like. The second interlayer insulating film 10b is composed of a film formed by the SOG method (an SOG film) or the like, and has a function as a level difference compensating film for compensating a level difference in the first metal layers 9a and 9b.

In the case where either the first interlayer insulating film 10a or the third interlayer insulating film 10c is a silicon nitride film and the other is a silicon oxide film or a film made of TEOS, gas such as steam generated from the SOG film due to heat application in the manufacturing process of the semiconductor device is blocked by the silicon nitride film, while such gas is let through the silicon oxide film or the film made of TEOS. As a result, such an event as the interlayer insulating film 10 may swell or be broken due to a pressure of the gas such as steam can be avoided. Note that the first and third interlayer insulating films 10a and 10c may be both silicon oxide films or TEOS films which are capable of letting gas through.

A barrier metal layer 13 (barrier metal layer) made of titanium-tungsten or tee like, on which a second metal layer 14 of an electrode cad 30 is formed, is provided on the interlayer insulating film 10 with an insulating film 11 therebetween. On the barrier metal layer 13, the second metal layer 14 serving as a pad metal and a wire made of aluminum or aluminum alloy is formed.

The aluminum or aluminum-alloy wire such as the second metal layer 14 tends to be broken due to stress migration caused by thermal stress, or the like. Therefore, it is particularly preferable to form the barrier metal layer 13 made of titanium tungsten chemical compound or the like under the aluminum or aluminum-alloy wire, and by doing so, liability of the aluminum or aluminum-alloy wire is enhanced.

Figure 2:
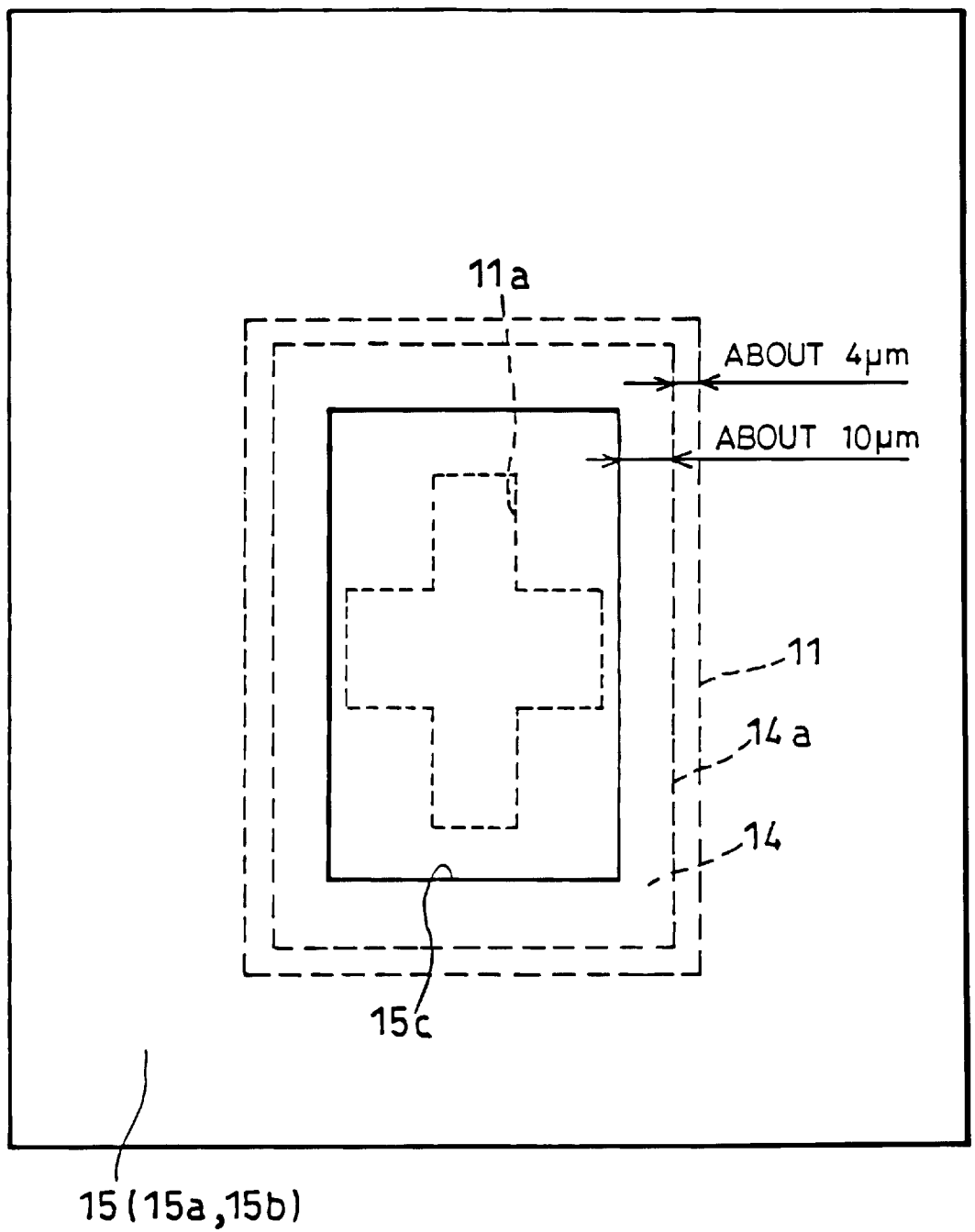
FIG. 2 is a plan view illustrating a lower side of an electrode pad in a semiconductor device in which an insulating film having adherence to a barrier metal layer is formed on an interlayer insulating film, the electrode pad having a slit as a passing pore which lets gas generated from the interlayer insulating film therethrough.
Figure 3:
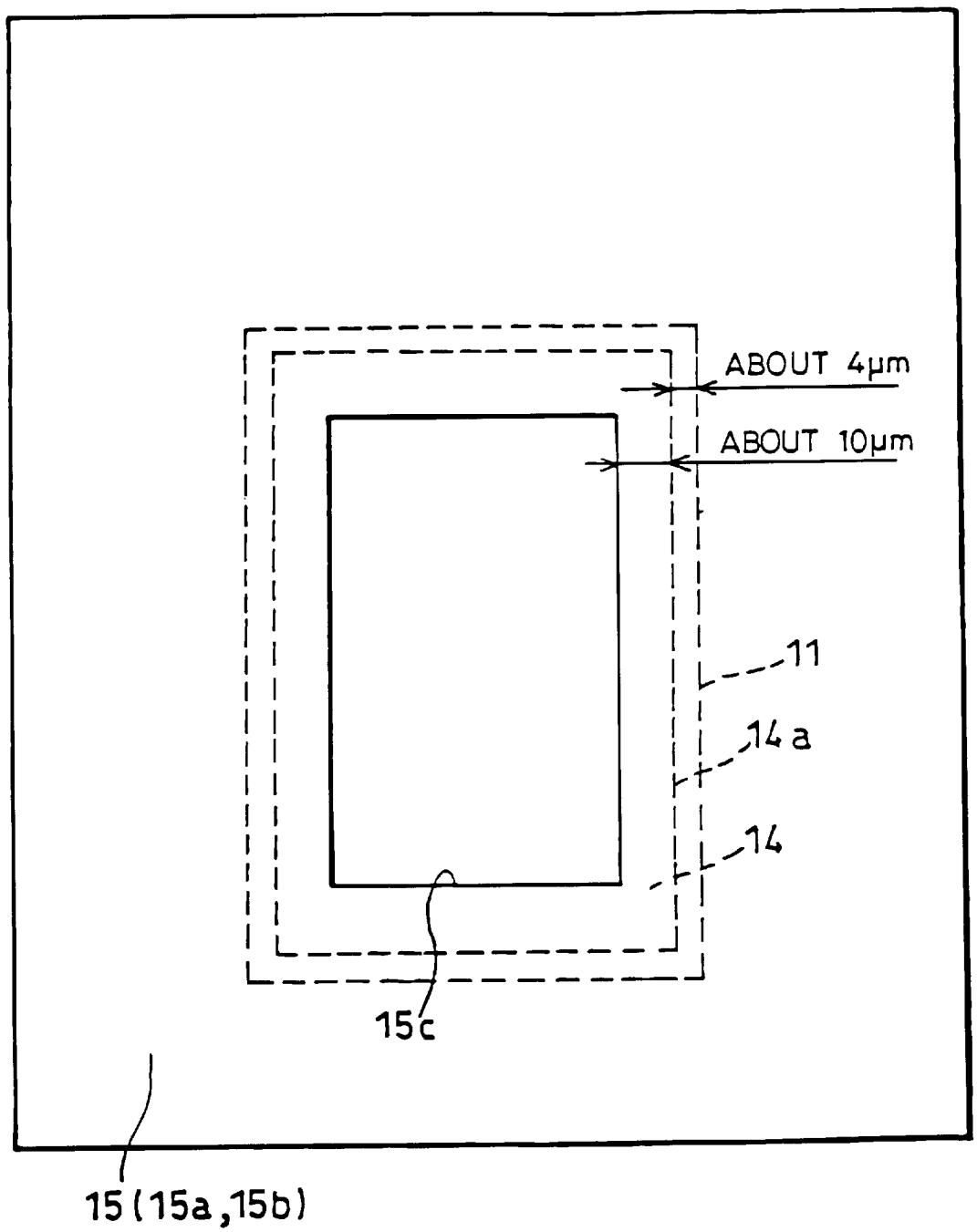
FIG. 3 is a plan view illustrating a lower side of an electrode pad in a semiconductor device in which such insulating film having no slit is provided.

The insulating film 11 is composed of a film having high adherence to the barrier metal layer 13, for example, a silicon nitride film, and it is formed by, for example, the plasma CVD method to a thickness of 200 nm to 600 nm. The insulating film 11, as shown in the plan view of FIG. 2, has a slit 11a which lets gas generated from the interlayer insulating film 10 pass. The insulating layer 11 is formed wider than the second metal layer 14 by about 4 $\mu$m or each side. Thus, by providing the slit 11a in the insulating film 11, the deformation, cracking, swelling, breaking, or the like of the interlayer insulating film 11 can be avoided, whereby a, semiconductor device of high quality can be achieved. Note that without forming a slit such as the slit 11a on the insulating film 11, the insulating film 11 may be provided substantially all over the second metal layer 14, as shown in FIG. 3, and in this case, substantially no problem occurs.

Furthermore, the insulating film 11 may be any insulating film provided that it has high adherence with the barrier metal layer 13, and it may be a film other than the silicon nitride film. It may be, for example, a silicon oxide film (SiO, $SiO_2$), or a film made of PSG; BPSG, NSG, or the like. Since titanium-tungsten and the like composing a material of the barrier metal layer 13 is oxidizable, a silicon nitride film which does not contain oxygen is preferable as the insulating film 11. Besides, since the silicon nitride film is a dense, hard film which hardly lets moisture through, an effect that leakage to the element under the insulating film 11 is prevented can be achieved.

At predetermined positions on the second metal layer 14, passivation film 15 (15a and 15b) is formed, which is made of PSG or silicon nitride. In the present embodiment, as shown in FIG. 2, an opening is formed in the passivation film 15 (15a and 15b) so that an edge 15c of the opening is positioned at a distance of, for example, 2.5 $\mu$m to 10 $\mu$m toward inside from an edge 14a of the second metal layer 14.

Further, a barrier metal layer 16 made of a refractory metal such as titanium or titanium-tungsten is formed on the second metal layer 14 and the passivation film 15 (15a and 15b), and a gold bump 17 which is electrically connected to an inner lead (not shown) is formed on the barrier metal layer 16. Note that in the case where the wire bonding method is applied, a gold wire or an aluminum-alloy wire is bonded to the second metal layer 14 as the pad metal. Thus, the electrode pad 30 is formed.

Figure 4:
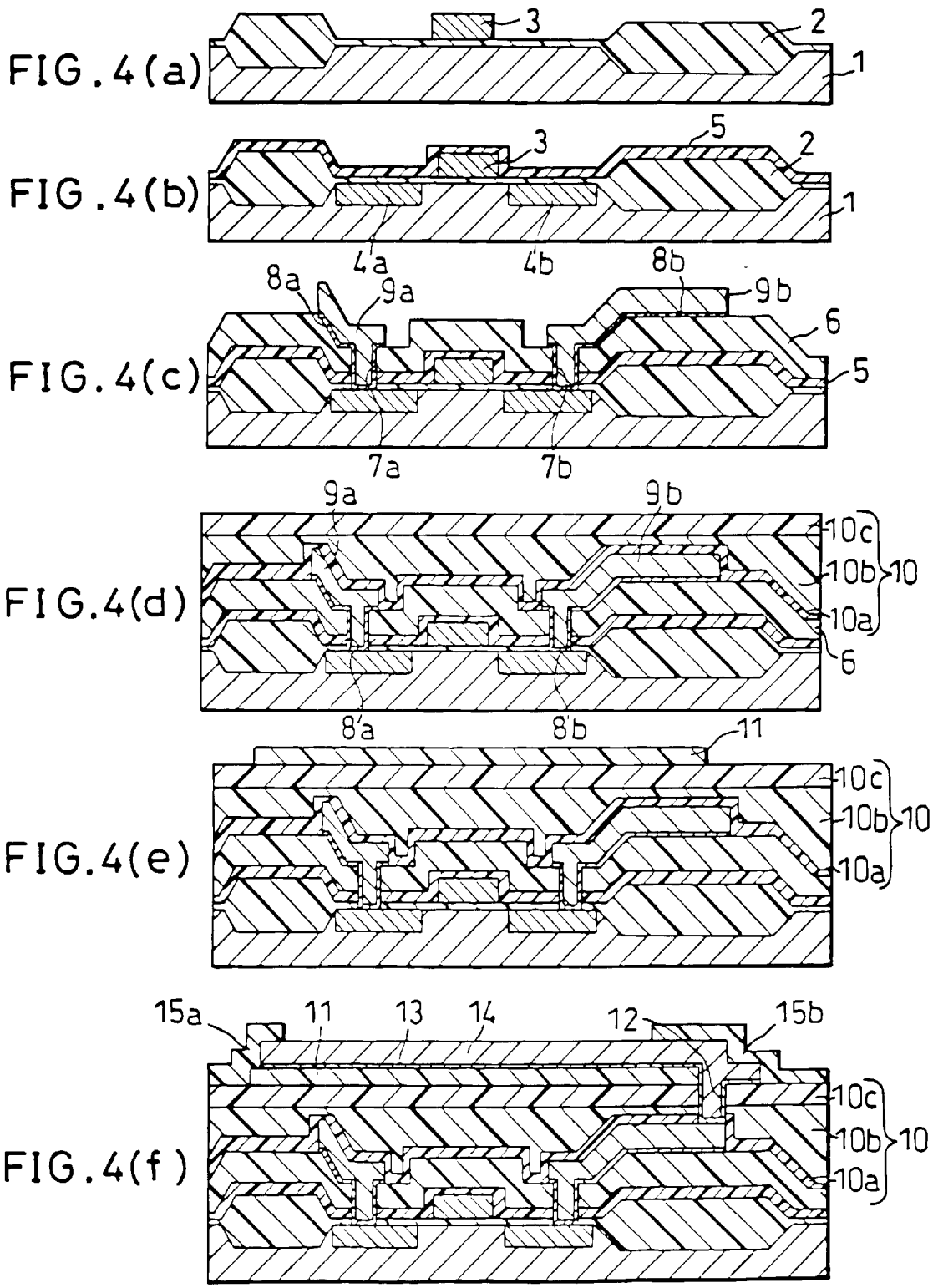
FIGS. 4(a) through 4(f) are cross-sectional views illustrating a manufacturing process of the semiconductor device.

The following description will explain a manufacturing process of a semiconductor chip in accordance with the present embodiment, while referring to FIGS. 4(a) through 4(f). The steps till the step shown in FIG. 4(d) are the same as those of the conventional manufacturing process.

Specifically, as shown in FIG. 4(a), after the silicon oxide film 2 is formed on the silicon substrate 1, the polysilicon film 3 is formed on the silicon oxide film 2, whereby the gate electrode is formed. Then, as shown in FIG. 4(b), after the diffusion layers 4a and 4b are formed in the silicon substrate 1, the CVD-silicon oxide film 5 is formed by the low-pressure CVD method. Subsequently, as show in FIG. 4(c), the BPSG film 6 is formed on the CVD-silicon oxide film 5 at room temperature, the CVD-silicon oxide film 5 and the BPSG film 6 are photo-etched, so that contact holes 7a and 7b are formed.

Thereafter, by the sputtering method, the barrier metal layers 8a and 8b made of titanium-tungsten or the like, and the first metal layers 9a and 9b made of aluminum or aluminum alloy such as aluminum silicon, aluminum copper silicon, or the like are formed metal wires. Then, by dry etching, the barrier metal layers 8a and 8b and the first metal layers 9a and 9b are re-shaped to necessary desired shapes.

Subsequently, as shown in FIG. 4(d), the interlayer insulating film 10 is formed on the BPSG film 6 and the first metal layers 9a and 9b. More specifically, on the BPSG film 6 and the first metal layers 9a and 9b, the first interlayer insulating film 10a composed of a silicon oxide film and the like is formed by, for example, the plasma CVD method, prior to a stage where the second interlayer insulating film 10b is formed. Subsequently, on the first interlayer insulating film 10a, the second interlayer insulating film 10b is formed by, for example, the spin coat method (the SOG method), in one step or two steps. Then, on the second interlayer insulating film 10b, the third interlayer insulating film 10c composed of a silicon oxide film and the like is formed by, for example, the plasma CVD method.

Thereafter, in the present embodiment, as shown in FIG. 4(e), the insulating film 11 composed of a film having high adherence to the barrier metal layer 13, such as a silicon nitride film, is formed in an area corresponding to the pad and therearound on the third interlayer insulating film 10c by the plasma CVD method.

Then, as shown in FIG. 4(f), a through hole 12 is formed in the interlayer insulating film 10 and the insulating film 11, and then, the barrier metal layer 13 made of titanium-tungsten or the like and the second metal layer) 14 made of aluminum or aluminum alloy are formed as a pad metal and a wire, respectively.

Thereafter, the passivation film 15 (15a and 15b) composed of a PSG film or a silicon nitride film is formed at a predetermined area on the second metal layer 14. Then, in the case where the gold wire or the aluminum wire is bonded to the second metal layer 14 as the pad metal by the wire bonding method, the process ends with this step, whereby a wafer of the semiconductor chip is completed.

On the other hand, in the case where the ILB method is utilized, as shown in FIG. 1, the barrier metal layer 16 made of a refractory metal such as titanium or titanium-tungsten is deposited on the second metal layer 14 and the passivation film 15 (15a and 15b) by the sputtering method. Then, the gold bump 17 is formed on the barrier metal layer 16 by the electric plating method, and an inner lead (not shown) is bonded to the gold bump 17.

According to the foregoing arrangement, the barrier metal layer 13 is provided on the interlayer insulating film 10, with the insulating film 11 provided therebetween, the insulating film 11 having high adherence to the barrier metal layer 13. Therefore, the adherence between the barrier metal layer 13, the insulating film 11, and the interlayer insulating film 10 surely increases. As a result, for example, in the case where an external force is applied to the electrode pad 30 upon bonding with respect to the same, the barrier metal layer 13 hardly comes off the lower side of the pad. Actually, coming-off of the electrode pad 30, that is, "open defect", did not occur at all.

Therefore, with the aforementioned arrangement, the "wire breaking defect" due to the exfoliation of the barrier metal layer 13 can be avoided. As a result, the semiconductor device of the area pad structure wherein the electrode pad 30 is formed on the active element 20 can be constantly mass-produced, whereby the semiconductor device comes to feature low costs, high quality, and high liability. Besides, since the "open defect" is eliminated, the yield of the semiconductor device of the area pad structure is surely improved.

As has been described above, the semiconductor device of the present invention, wherein the barrier metal layer on which the pad metal of the electrode pad is formed is provided on the active element of the semiconductor substrate, with the interlayer insulating film therebetween, is characterized in that the insulating film having high adherence to the barrier metal layer is provided between the interlayer insulating film and the barrier metal layer.

With the above arrangement, the semiconductor device is arranged so that (1) the interlayer insulating film and (2) the barrier metal layer on which the pad metal of the electrode pad is formed, are laminated in this order on the active element of the semiconductor substrate.

Herein, since the barrier metal layer is provided on the interlayer insulating film, with the insulating film having high adherence to the barrier metal layer provided therebetween, the adherence between the three layers, that is, the barrier metal layer, the insulating film, and the interlayer insulating film is surely improved. As a result, even in the case where an external force is applied to the electrode pad upon bonding of the same, OF the barrier metal layer scarcely peels off the layer beneath.

Therefore, with the aforementioned arrangement, the breaking of a wire stemming from the exfoliation of the barrier metal layer can be avoided. As a result, the semiconductor device of the area pad structure wherein the electrode pad is formed on the active element is constantly mass-produced, whereby the semiconductor device comes to feature lower costs, high quality, and high liability. Besides, since the exfoliation the barrier metal layer is avoided, the yield of the semiconductor device of the area pad structure is surely improved.

The semiconductor device of the present invention, having the aforementioned arrangement, is preferably characterized in that the insulating film is a silicon nitride film.

With the foregoing arrangement, oxidization of the barrier metal layer is considerably suppressed when the insulating film composed of the silicon nitride film is adhering to the barrier metal layer, since the silicon nitride film does not contain oxygen. Therefore, the barrier metal layer and the insulating film are further surely adhered to each other. Moreover, since the silicon nitride film is a dense and hard film which hardly lets moisture through, the "leakage defect" of the active element under the insulating layer can be prevented. The plasma CVD method is preferably applied to form the silicon nitride film, since by doing so the silicon nitride film is made to have good properties as the insulating layer.

Besides, the barrier metal layer is preferably made of an titanium compound since in this case the liability of the aluminum or aluminum-alloy wire formed on the barrier metal layer is further enhanced. Titanium-tungsten is particularly preferable as a material to form the barrier metal layer.

The semiconductor device of the present invention, having the aforementioned arrangement, is preferably characterized in that the insulating layer has a slit which lets gas generated from the interlayer insulating film through.

According to the aforementioned arrangement, the gas such as moisture generated from the interlayer insulating film due to heat application in the manufacturing process of the semiconductor device is discharged to outside through the slit provided in the insulating film. Therefore, the deformation, cracking, swelling, or breaking of the interlayer insulating film due to the pressure of the gas can be avoided, whereby the semiconductor device of high quality can be achieved.

The semiconductor device of the present invention, having the aforementioned arrangement, is characterized in that the interlayer insulating film is a trilaminar insulating film having first, second and third layers, the first and third layers being insulating films containing silicon, the second layer being a level difference compensating film. Here, the interlayer insulating film is preferably a trilaminar insulating film composed of a silicon nitride film, an SOG film, and a silicon oxide film laminated in this order.

According to the aforementioned arrangement, the interlayer insulating film includes an SOG film. Therefore, a level difference under the interlayer insulating film is compensated by the SOG film. Besides, with the aforementioned arrangement, the interlayer insulating film has a structure wherein the SOG film is sandwiched by the silicon nitride film and the silicon oxide film. Therefore, gas such as steam generated from the SOG film due to heat application in the manufacturing process is blocked by the silicon nitride film while it is let through the silicon oxide film, thereby going outside. As a result, the swelling and breaking of the interlayer insulating film due to a gas pressure of steam or the like can be avoided.

Furthermore, the interlayer insulating film may be a trilaminar insulating film composed of an TEOS film, an SOG film, and a TEOS film which are laminated in this order.

With this arrangement wherein the interlayer insulating film includes an SOG film, a level difference under the interlayer insulating film can be compensated by the SOG film. Besides, gas such as steam generated from the SOG film due to heat application in the manufacturing process is let through the TEOS films sandwiching the SOG film, thereby going out. As a result, the swelling and breaking of the interlayer insulating film due to a gas pressure of steam or the like can be avoided.

Second Embodiment

The following description will explain another embodiment of the present invention, while referring to the drawings. The members having the same structure (function) as those in the above-mentioned embodiment will be designated by the same reference numerals and their description will be omitted.

Figure 5:
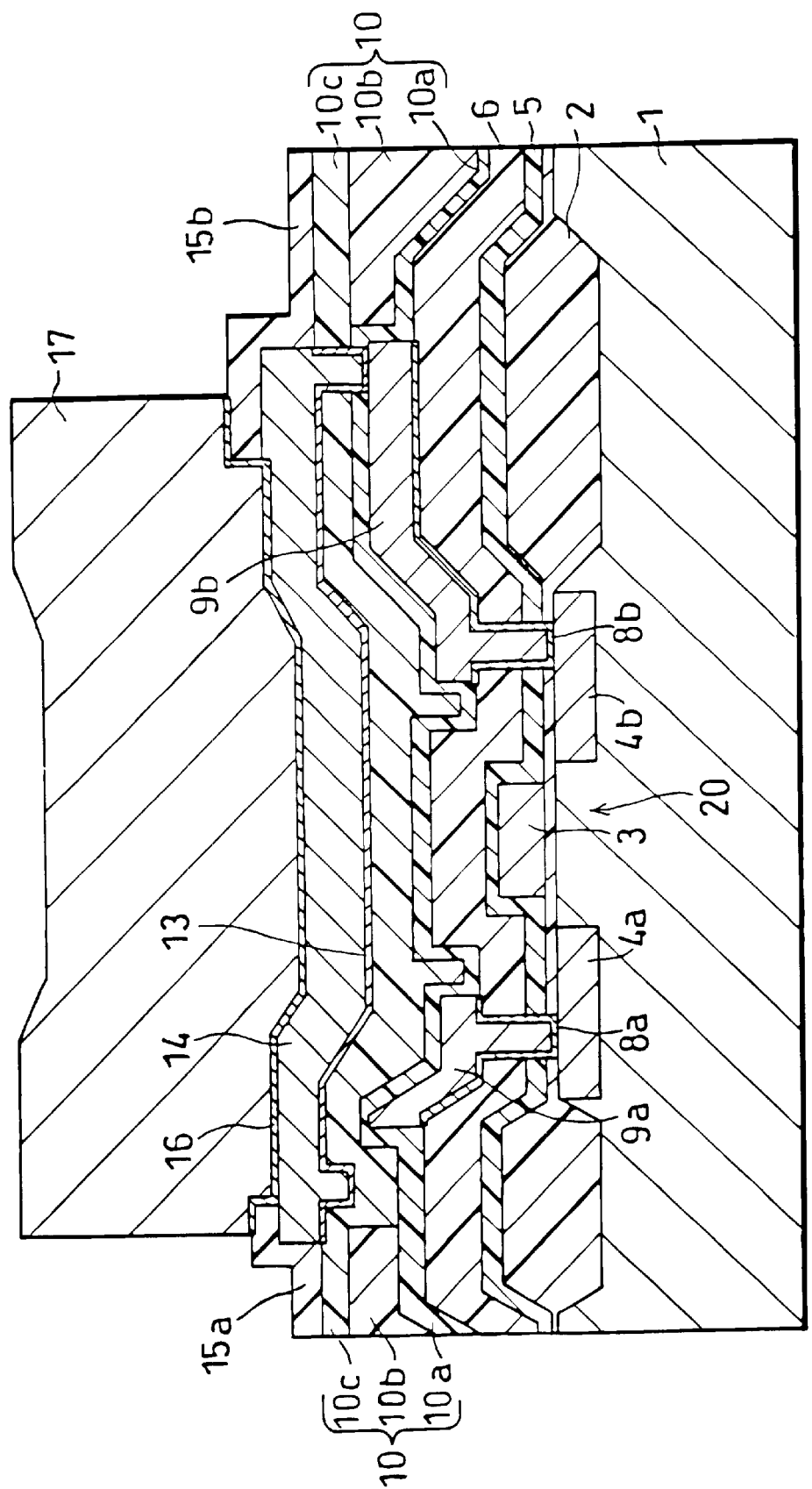
FIG. 5 is a cross-sectional view illustrating an arrangement of a semiconductor device in accordance with an embodiment of the present invention.

As shown in FIG. 5, a semiconductor chip in accordance with the present embodiment has the same arrangement as that of the semiconductor chip shown in FIG. 1 except that: (1) the insulating film 11 is not formed on the third interlayer insulating film 10c; and (2) a portion of the second interlayer insulating film 10b right under the second metal layer 14 is removed. A manufacturing process of a semiconductor device arranged as above is as follows. The manufacture proceeds through the same steps as those in the first embodiment till the step shown in FIG. 4(c), and then, a film containing silicon, that is, either a silicon oxide film, a silicon nitride film, or a film made of TEOS is formed as the first interlayer insulating film 10a by the plasma CVD method. Subsequently, a level difference of the first metal layers 9a and 9b is compensated by the spin coat method, and the second interlayer insulating film 10b is formed in one step or two steps by the SOG method and the like so that the interlayer insulating film 10 has a flat surface.

Then, a portion of the second interlayer insulating film 10b which will come right under the second metal layer 14 is completely removed by etching so that the removed portion is wider than an area of the second metal layer 14 by 4 μm on each side. Thereafter, the third interlayer insulating film 10c which is composed of a film made of a silicon compound, such as a silicon oxide film or a silicon nitride film, is formed by the plasma CVD method. The subsequent steps are the same as those in the first embodiment (except the steps for forming the insulating film 11).

By thus arranging the semiconductor chip, only the electrode pad 30 has an uneven surface, but a level difference causing the unevenness is at most about 1 μm high, and this level difference did not lead to any problem such as the breaking of a wire. Besides, though the electrode pad 30 has the uneven surface, bonding was not reversely affected.

Figure 6:
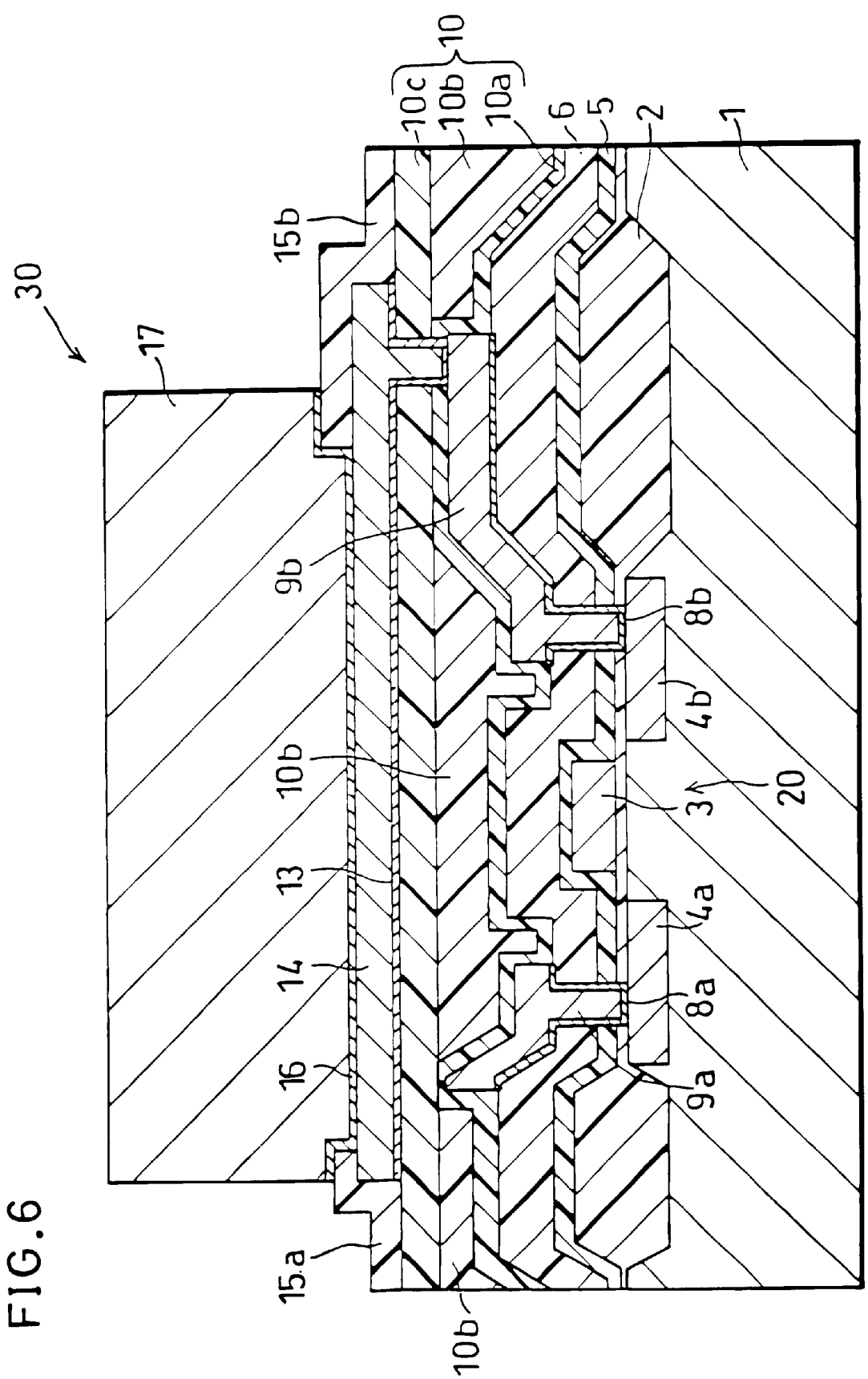
FIG. 6 is a cross-sectional view illustrating another arrangement of the semiconductor device.

Instead of completely removing the portion of the second interlayer insulating film 10b right under the second metal layer 14, the second interlayer insulating film 10b may be formed, as shown in FIG. 6, to a minimum thickness necessary for compensating the level difference in the first metal layers 9a and 9b. In this case, the second interlayer insulating film 10b may be formed on the first interlayer insulating film 10a, then, the second interlayer insulating film 10b is thinned by 50 nm to 60 nm by light etching till the highest portions of the first interlayer insulating film 10a appears.

In this structure, the second interlayer insulating film 10b does not exist above the highest portions of the first metal layers 9a and 9b, and the second interlayer insulating film 10b remain only in a region between the first metal layers 9a and 9b. Therefore, as in the first embodiment, the level difference in the first metal layers 9a and 9b is compensated, and the interlayer insulating film 10 can be made to have a flat surface. By doing so, actually, the breakdown of a part under the second metal layer 14 due to an external force after bonding did not occur. Therefore, the level difference compensation in the part right under the second metal layer 14 and the prevention of breakdown of the same part can be achieved at the same time.

Figure 7:
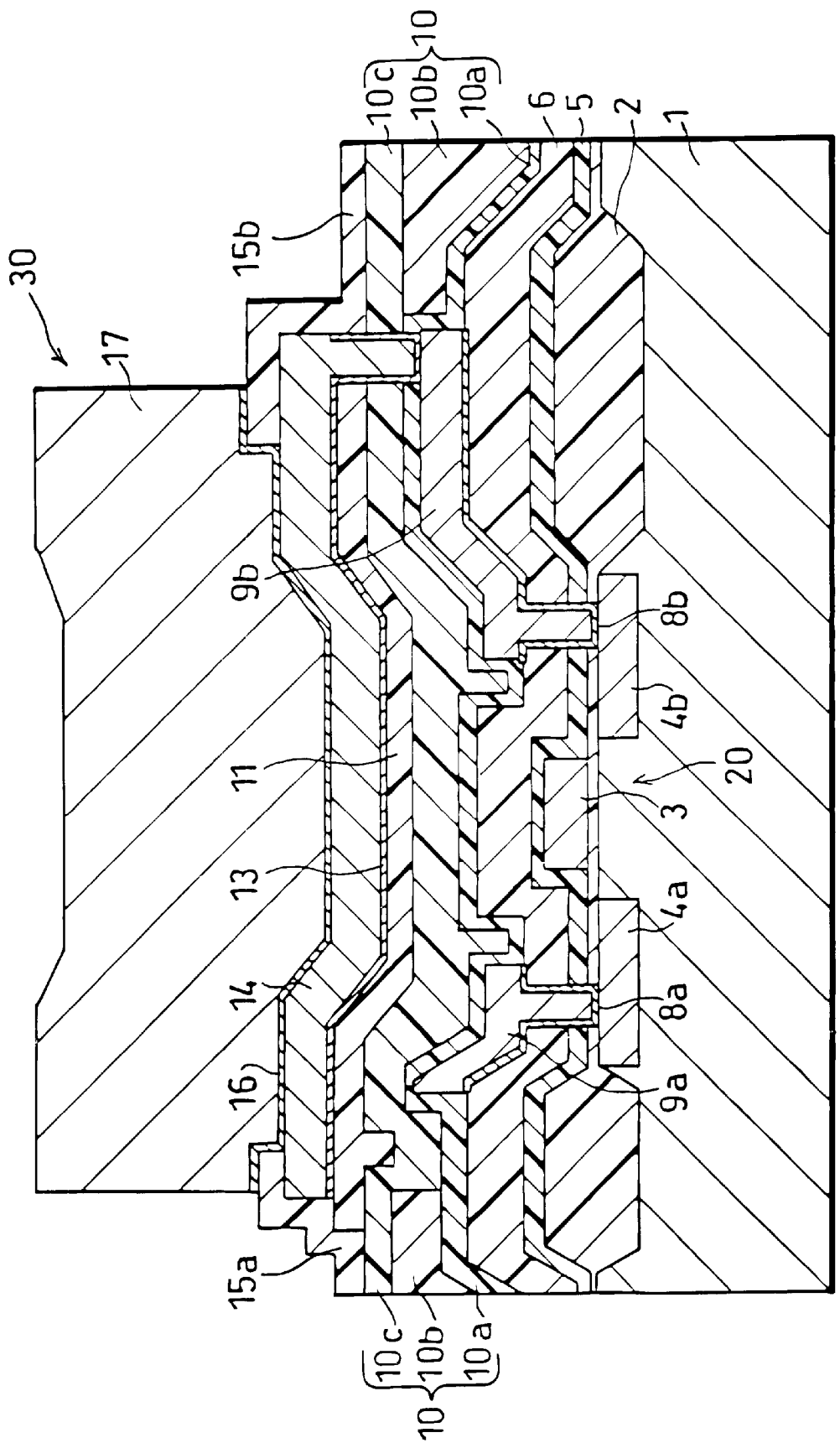
FIG. 7 is a cross-sectional view illustrating still another arrangement of the semiconductor device.

Furthermore, as shown in FIG. 7, a semiconductor chips may be arranged by combining the foregoing arrangement and the arrangement in the first embodiment. More specifically, to form the semiconductor chip, the insulating film 11 having high adherence to the barrier metal layer 13 may be provided on the third interlayer insulating film 10c, and a portion of the second interlayer insulating film 10b right only under the second metal layer 14 is removed.

In this case, in an article in which a bump has been already formed, the part under the second metal layer 14 was not damaged even when stress was applied intensively to the gold bump 17 by, for example, harshening ILB conditions (temperature: 560° C., load: 60 g/bump, bonding time: 1 second), or bonding an inner lead to the gold bump 17 with an actual bonding position shifted from a right position by not less than 10 μm.

Furthermore, not particularly shown, but the insulating film 11 having high adherence to the barrier metal layer 13 may be provided on the third interlayer insulating film 10c, and the second interlayer insulating film 10b may be formed to a minimum thickness necessary for compensating the level difference in the first metal layers 9a and 9b.

As has been described, the semiconductor device of the present invention has an active element with a metal wire on a semiconductor substrate, and on the active element, there is provided a barrier metal layer on which the pad metal of the electrode pad is formed, with the interlayer insulating film provided between the active element and the barrier metal layer. This semiconductor device is characterized in that the interlayer insulating film has at least the level difference compensating film for compensating the level difference of the metal wire, and a portion of the level difference film right under the pad metal is removed.

According to the foregoing arrangement, the barrier metal layer, on which the pad metal of the electrode pad is formed, is provided on the active element on the semiconductor substrate, with the interlayer insulating film provided therebetween, the interlayer insulating film having the level difference compensating film which is mechanically fragile.

Here, only a portion under the pad metal is completely removed from the level difference compensating film which is easily broken by the stress upon bonding. Therefore, the level difference of the metal wire is not compensated, but the breakdown of the level difference compensating film does not occur under the pad metal.

Accordingly, with the above arrangement, the exfoliation of the barrier metal layer from the part thereunder due to the breakdown of the level difference compensating film can be avoided. By doing so, the semiconductor device of the area pad structure wherein the electrode pad is formed on the active element is constantly mass-produced, whereby the semiconductor device comes to feature lower costs, high quality, and high liability. Besides, since the exfoliation the barrier metal layer is avoided, the yield of the semiconductor device of the area pad structure is surely improved.

Furthermore, the semiconductor device of the present invention has an active element with a metal wire on a semiconductor substrate, and a barrier metal layer on which the pad metal of the electrode pad is formed is provided on the active element, with the interlayer insulating film provided between the active element and the barrier metal layer. This semiconductor device may be characterized in that the interlayer insulating film has at least the level difference compensating film for compensating the level difference of the metal wire, and the level difference compensating film has the minimum thickness necessary for compensating a level difference of the metal wire.

According to the aforementioned arrangement, the barrier metal layer, on which the pad metal of the electrode pad is formed, is provided on the active element of the semiconductor substrate, with the interlayer insulating film having the level difference compensating film provided therebetween.

Here, since the level difference compensating film under the pad metal has the minimum thickness necessary for compensating a level difference of the metal wire, a degree of breakdown of the level difference compensating film which is normally easily broken by shock or the like can be lowered, in addition to that the compensation of the level difference is achieved. In other words, the prevention of the breakdown of the part under the pad metal and the level difference compensation can be achieved at the same time.

Therefore, with the aforementioned arrangement, the semiconductor device of the area pad structure wherein the electrode pad is formed on the active element is constantly mass-produced, whereby the semiconductor device comes to feature lower costs, high quality, and high liability. Besides, since the exfoliation the barrier metal layer is avoided, the yield of the semiconductor device of the area pad structure is surely improved.

Third Embodiment

The following description will explain still another embodiment of the present invention, while referring to the drawings. The members having the same structure (function) as those in the above-mentioned embodiment will be designated by the same reference numerals and their description will be omitted.

Figure 8:
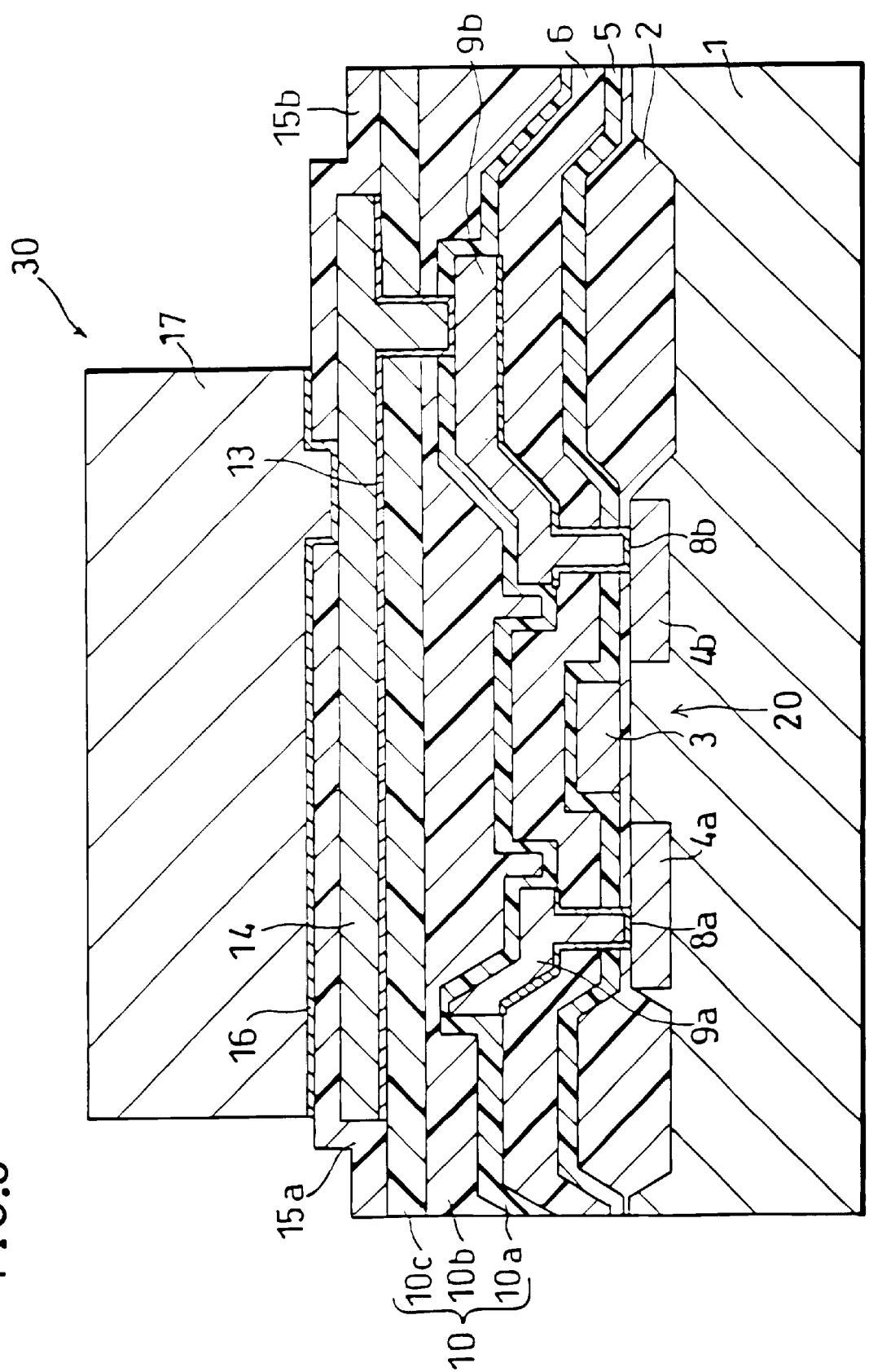
FIG. 8 is a cross-sectional view illustrating an arrangement of semiconductor device in accordance with still an another embodiment of the present invention.

As shown in FIG. 8, the passivation film 15 (15a and 15b), which is normally formed so as to cover a part of the second metal layer 14, is formed, in the present embodiment, so as to cover a greater part of the second metal layer 14, so that the stress occurring upon bonding or after bonding is eased. The rest of the arrangement is the same as that in the first embodiment except that the insulating film 11 is provided in the first embodiment while it is not in the present embodiment.

Figure 9:
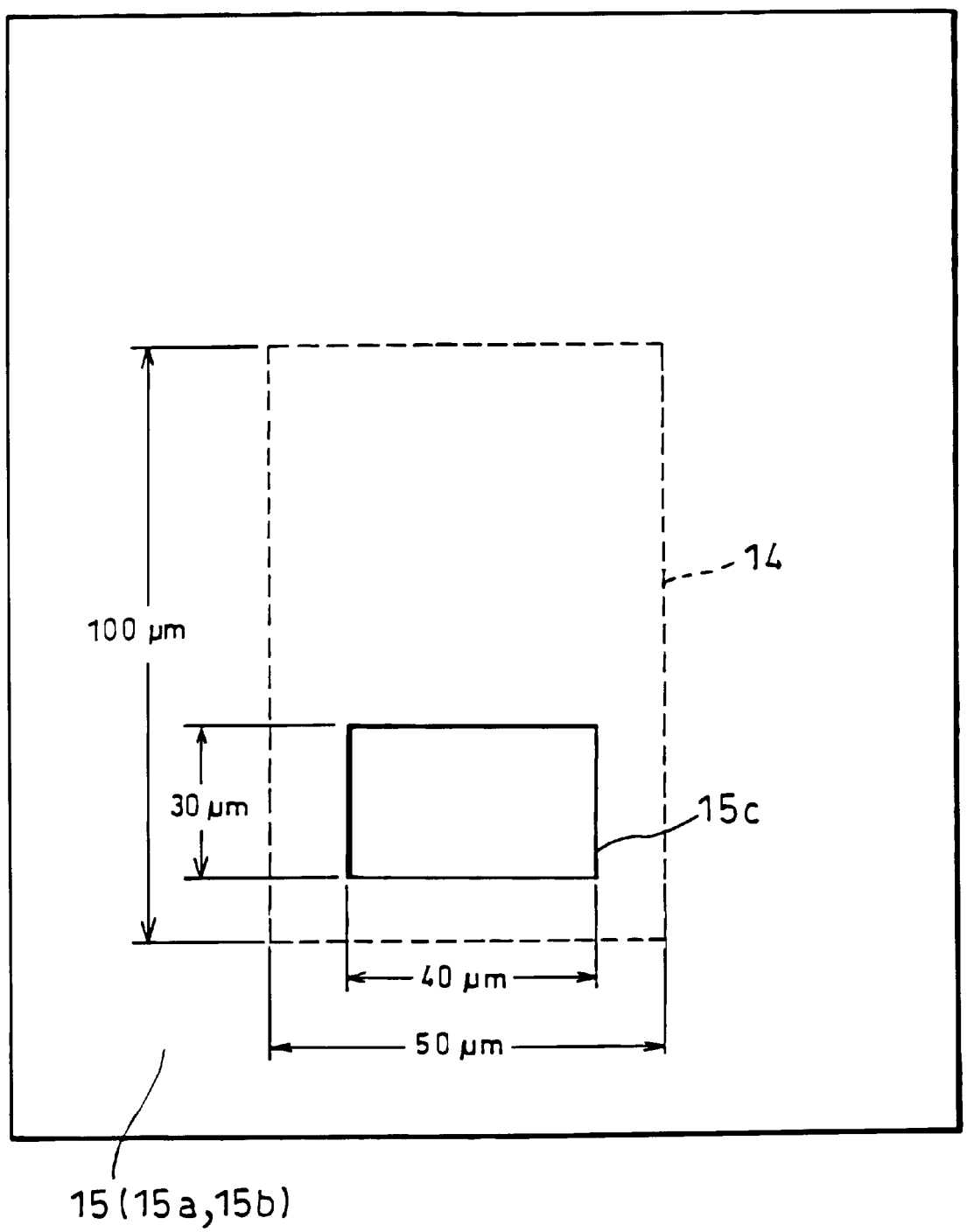
FIG. 9 is a plan view illustrating a lower side of an electrode pad of the semiconductor device.

In this case, as shown in FIG. 9, since the second metal layer 14 is 50 μm×100 μm in size, the passivation film 15 (15a and 15b) is formed so as to cover a large part of the second metal layer 14, with an opening 15c formed to 40 μm×30 μm in size.

With this arrangement, in the case where stress is applied to the part under the second metal layer 14 by shock or stress upon bonding and the barrier metal layer 13 almost peels off the part thereunder, the barrier metal layer 13 is held by the passivation film 15, whereby the barrier metal layer 13 hardly peels off. Therefore, with the above arrangement wherein the passivation film 15 is provided so as to cover a large part of the second metal layer 14, possibility of the exfoliation of the second metal layer 14 from the part thereunder is surely decreased.

Needless to say, this arrangement of the present embodiment wherein the passivation film 15 (15a and 15b) is formed so as to cover a large part of the second metal layer 14 is applicable to the first and second embodiments.

As has been described, the semiconductor device of the present invention is characterized in that a passivation film is provided on the pad metal so as to cover a large part of the pad metal.

According to this arrangement, the passivation film which is normally provided so as to cover a part of the pad metal is formed so as to cover a large part of the pad metal. Therefore, in the case where stress is applied to the part under the pad metal by shock or stress upon bonding and after bonding and the barrier metal layer almost peels off the part, the barrier metal layer is held by the passivation film, whereby the barrier metal layer hardly peels off. Therefore, by providing the passivation film as described above, possibility of the exfoliation of the barrier metal layer from the part thereunder is surely decreased.

Fourth Embodiment

The following description will explain another embodiment of the present invention, while referring to the drawings. The members having the same structure (function) as those in the first through third embodiments will be designated by the same reference numerals and their description will be omitted.

Figure 10:
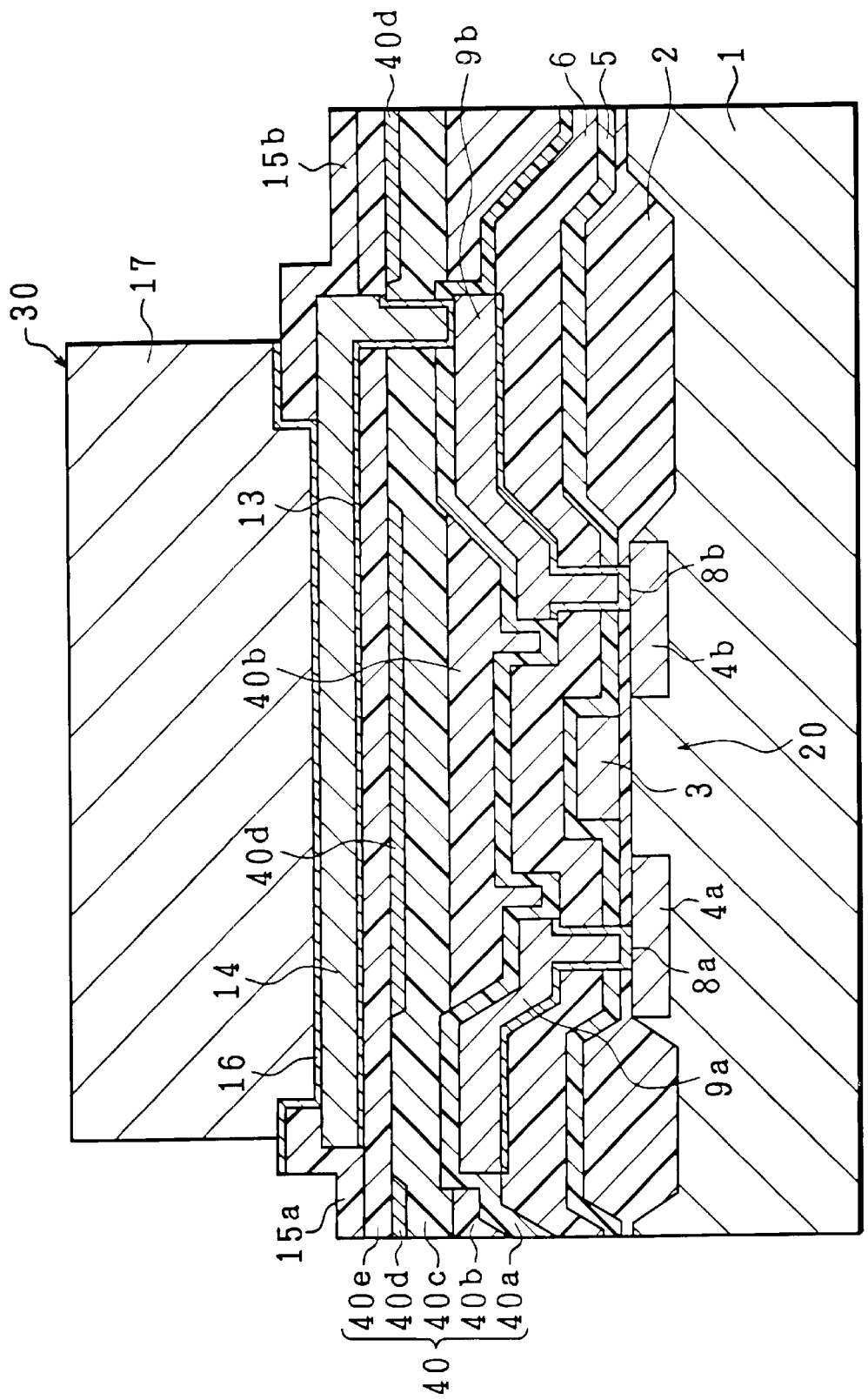
FIG. 10 is a cross-sectional view illustrating an arrangement of a semiconductor device in accordance with still another embodiment of the present invention.

As shown in FIG. 10, in the present embodiment, an interlayer insulating film 40 having a quintuple layer structure (hereinafter referred to as a quintuple-structure interlayer insulating film 40) is formed between the second metal layer 14 and the first metal layers 9a and 9b, so that high reliability is obtained in environmental tests during or after an inner lead bonding (ILB) operation. The arrangement of the present embodiment is completely identical to that of the first embodiment except that the above interlayer insulating film 40 is provided.

A first layer (a first-layer insulating film 40a) of the foregoing interlayer insulating film having the quintuple layer structure (hereinafter referred to as a quintuple-structure interlayer insulating film 40) is a silicon nitride film or a silicon oxide film. A second layer, (a second-layer insulating film 40b) of the same is an SOG film, which is formed so as to cover the first-layer insulating film 40a except a portion thereof. A third layer (a third-layer insulating film 40c) of the same is, like the first-layer insulating film 40a, a silicon nitride film or a silicon oxide film. A fourth layer (a fourth-layer insulating film 40d) of the same is, like the second-layer insulating film 40b, an SOG film, which is formed on the third-layer insulating film 40c so that a portion or a greater part of the third-layer insulating film 40c is uncovered. A fifth layer (a fifth-layer insulating film 40e) is, like the first-layer and third-layer insulating films 40a and 40c, a silicon nitride film or a silicon oxide film.

The following description will explain a method for forming the quintuple-structure insulating film 40. First of all, as shown in FIG. 11(a), a silicon oxide film 2, a gate electrode composed of a polysilicon film 3, diffusing layers 4a and 4b, barrier metal layers 8a and 8b, and first metal layers 9a and 9b are formed on a silicon substrate 1.

Figure 11:
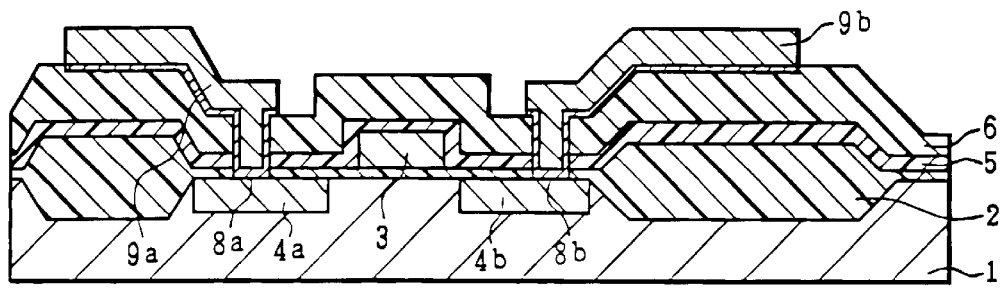
FIGS. 11(a) through 11(d) are cross-sectional views illustrating a manufacturing process of the semiconductor device shown in FIG. 10.
Figure 11:
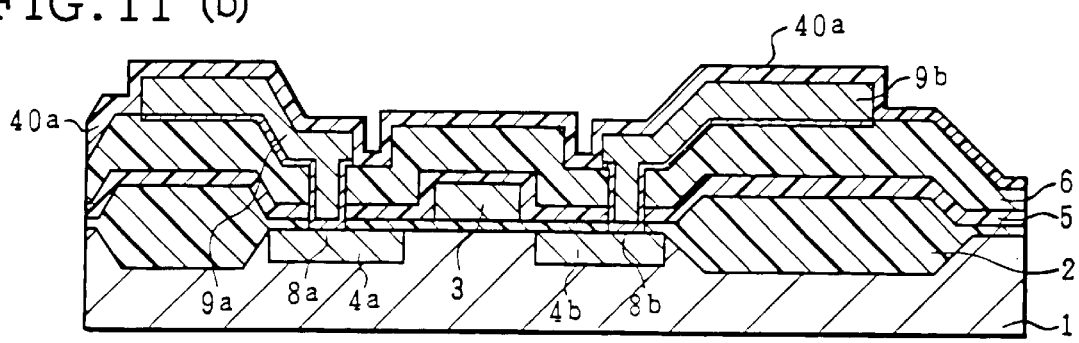
Figure 11:
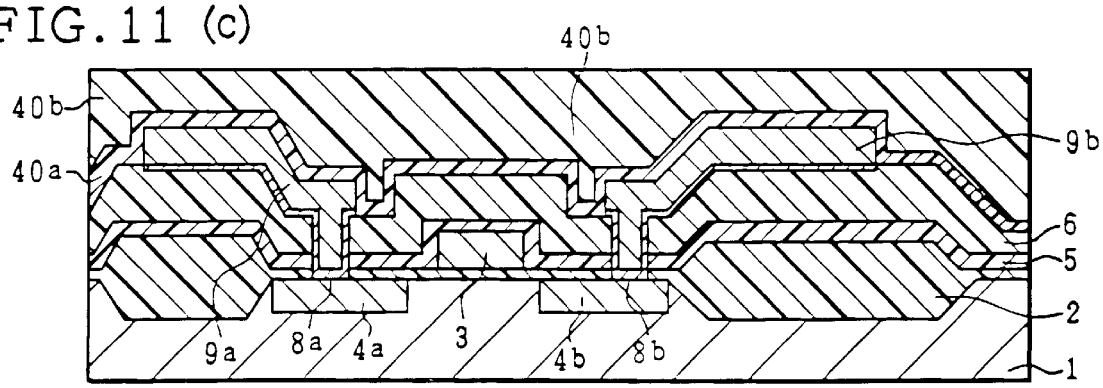
Figure 11:
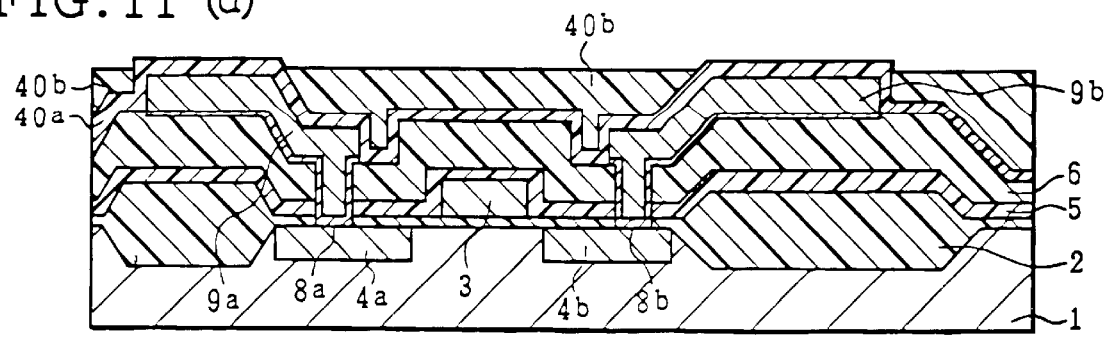

Next, as shown in FIG. 11(b), the first-layer insulating film 40a, which is either a silicon nitride film or a silicon oxide film, is formed on the first metal layers 9a and 9b. The film forming method here used should not be limited to any specific film forming method, but the CVD method is preferable. The first-layer insulating film 40a preferably has a thickness of 200 nm to 600 nm.

Thereafter, as shown in FIG. 11(c), the SOG film as the second-layer insulating film 40b is formed on the first-layer insulating film 40a by the spin coat method. Since the second-layer insulating film 40b (SOG film) preferably has a thickness of 300 nm to 800 nm, the SOG film is formed by executing a spin-coating operation twice in the present embodiment.

Subsequently, as shown in FIG. 11(d), the second-layer insulating film 40b thus formed is etched. By doing so, the thickness of the second insulating film 40b is reduced on the whole, and particularly, portions of the second insulating film 40b above the first metal layers 9a and 9b are completely removed, whereby portions of the first-layer insulating film 40a corresponding to these portions are uncovered. Note that the second-layer insulating film 40b remains in a region between the first metal layers 9a and 9b. The dry etching is conducted as the etching after forming the SOG film in the present embodiment, but the etching should not be limited to this, and instead an etching by mechanically grinding may be applied.

Figure 12:
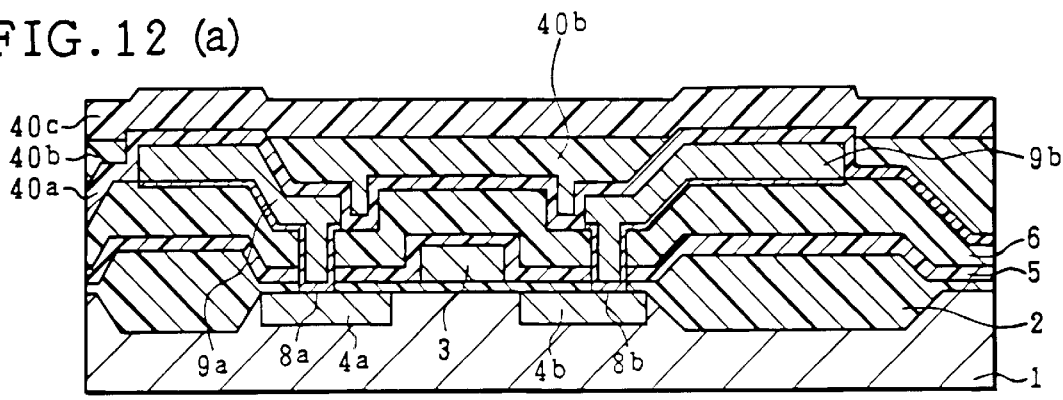
FIGS. 12(a) through 12(d) are cross-sectional illustrating a manufacturing process of the semiconductor device shown in FIG. 10, which process ensues to the process shown in FIGS. 11(a) through 11(d).
Figure 12:
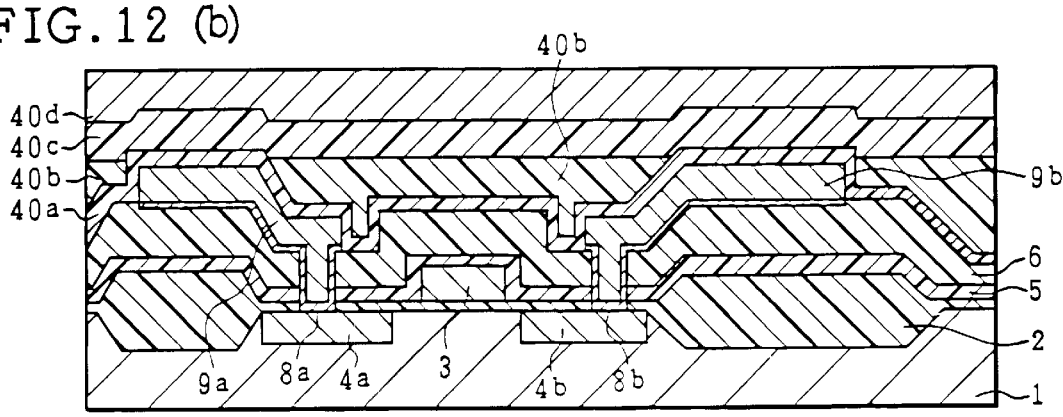
Figure 12:
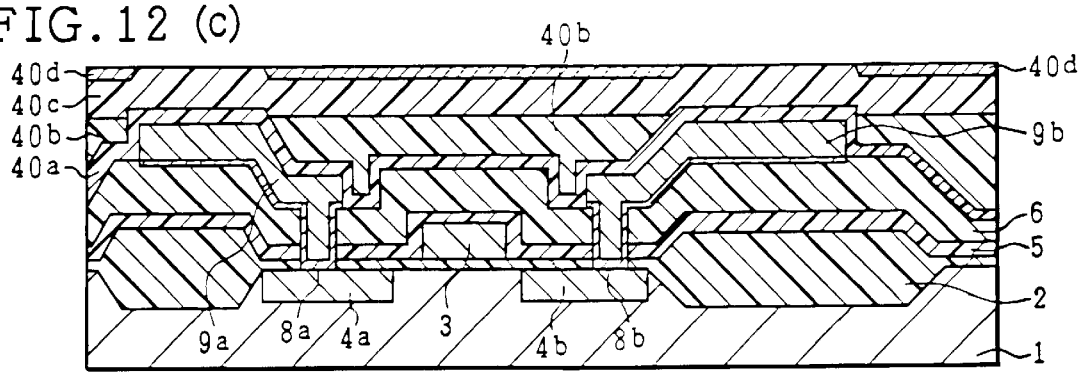
Figure 12:
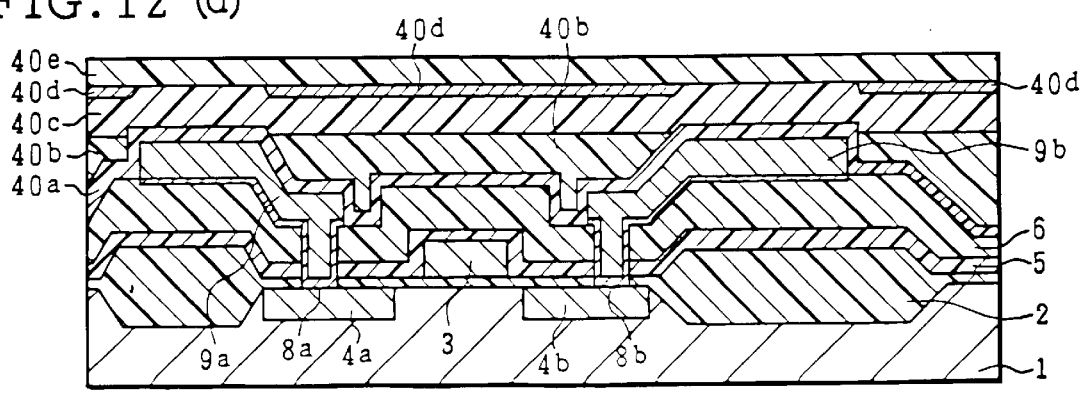

Then, as shown in FIG. 12(a), a silicon nitride film or a silicon oxide film, like the first-layer insulating film 40a, is formed as the third-layer insulating film 40c on the second-layer insulating film 40b. The third-layer insulating film 40c has a thickness of 200 nm to 600 nm, like the first-layer insulating film 40a. The third-layer insulating film 40c is in direct contact with the uncovered portions of the first-layer insulating film 40a formed on the first metal layers 9a and 9b, which portions are uncovered with the second-layer insulating film 40b.

Thereafter, as shown in FIG. 12(b), an SOG film as the fourth-layer insulating film 40d is formed on the third-layer insulating film 40c by the spin coat method. The fourth-layer insulating film 40d (SOG film) preferably has a thickness of about 300 nm. Therefore, unlike the case where the second-layer insulating film 40b is formed, there is no need to apply a spin coat operation twice to form the fourth-layer insulating film 40d, and it can be formed by a single spin coat operation.

Thereafter, as shown in FIG. 12(c), the SOG film as the fourth-layer insulating film 40d is etched. Here, it is preferable to remove a greater part of the SOG film. For example, the SOG film may remain above a region between the first metal layers 9a and 9b as shown in FIG. 12(c), but a greater part of the rest is preferably removed. As a result, at least the portions of the third-layer insulating film 40c above the first metal layers 9a and 9b are substantially completely uncovered.

It should be noted that the etching herein is preferably applied not only to the SOG film as the fourth-layer insulating film 40d but also to the silicon nitride film or the silicon oxide film as the third-layer insulating film 40c. By doing so, a surface after the formation of the fourth-layer insulating film 40d becomes further flatter and smoother.

Next, as shown in FIG. 12(d), a silicon nitride film or a silicon oxide film, like the first-layer and third-layer insulating films 40a and 40c, is formed as the fifth-layer insulating film 40e on the third-layer and fourth-layer insulating films 40c and 40d. The fifth-layer insulating film 40e also preferably has a thickness of 200 nm to 600 nm. Since a greater part of the fourth-layer insulating film 40d is preferably removed as described above, a greater part of the fifth-layer insulating film 40e is in direct contact with the third-layer insulating film 40c.

Figure 13:
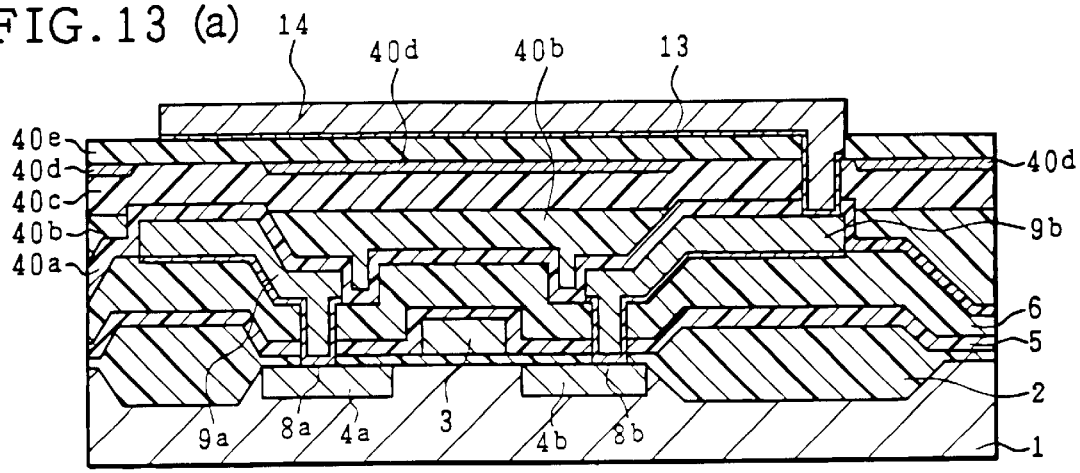
FIGS. 13(a) through 13(c) are cross-sectional views illustrating a manufacturing process of the semiconductor device shown in FIG. 10, which process ensue to the process shown in FIGS. 12(a) through 12(d).
Figure 13:
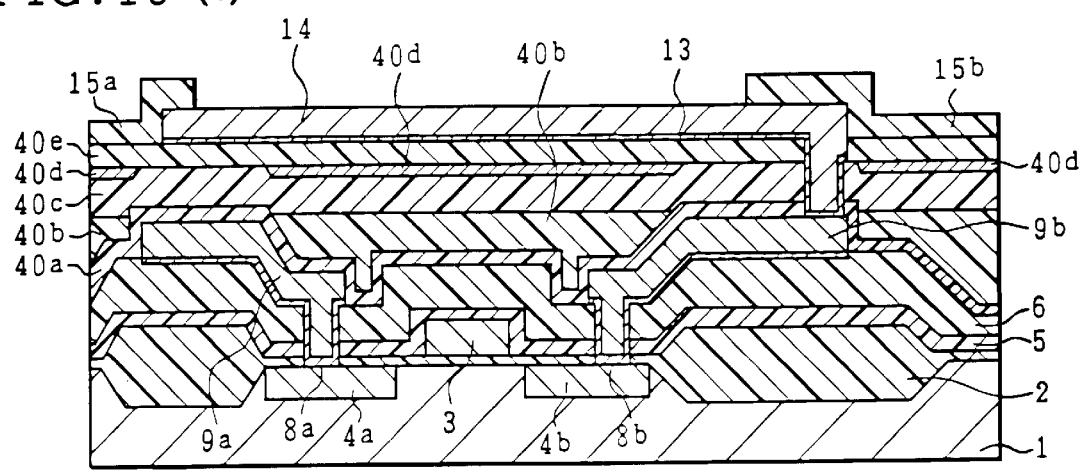
Figure 13:
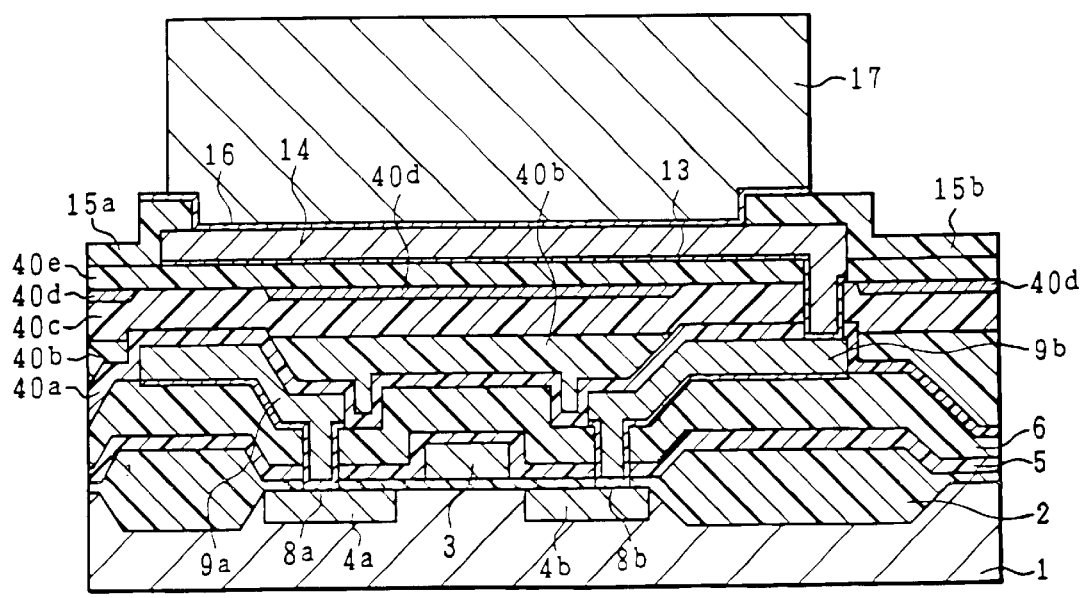

Thereafter, as shown in FIG. 13(a), a contact hole is made in the quintuple-structure insulating film 40 on the first metal layer 9b so that a portion of the first metal layer 9b is uncovered. Then, the second metal layer 14 as the pad metal is formed so that it comes into contact with the first metal layer 9b through the contact hole. Subsequently, as shown in FIG. 13(b), a passivation film 15 (15a and 15b) is formed so as to cover the second metal layer 14, and a pad area is opened.

L Finally, as shown in FIG. 13(c), a barrier metal 16 made of titanium-tungsten or the like is formed in the pad area, and a gold bump 17 is formed by gold plating. Thus, a semiconductor device having the quintuple-structure insulating film 40, in accordance with the present embodiment, is formed.

In the semiconductor device having the foregoing quintuple-structure insulating film 40, the SOG film which is mechanically fragile remains only in a region between the first metal layers 9a and 9b. Therefore, even when an external force upon the ILB operation is exerted to the quintuple-structure insulating film 40 through the gold bump 17, the external force does not concentratively affect the SOG film. As a result, the quintuple-structure insulating film 40 has a structure which is extremely mechanically stable.

Note that even in the structure in accordance with the present embodiment, the quintuple-structure insulating film 40 tends to have a lower mechanical strength in the case where a distance between the first metal layers 9a and 9b below the gold bump 17 is not less than 100 $\mu$m.

Here, a silicon nitride film or a silicon oxide film is applied as each of the first-layer, third-layer, and fifth-layer insulating films 40a, 40c, and 40e, and further, as the silicon oxide film is made of NSG or PSG. In the present embodiment, the silicon nitride film is preferably selected from among them. This is because the silicon nitride film has particularly preferable features regarding leakage resistance after absorbing moisture.

As described above, the semiconductor device of the present invention is arranged so as to have a quintuple-structure interlayer insulating film between the first metal layers made of aluminum or aluminum alloy and the pad metal.

Therefore, with the above arrangement, the SOG film which is mechanically fragile remains only in a region between the first metal layers. Therefore, even when an external force upon the ILB operation is exerted to the interlayer insulating film through the bump, the external force does not concentratively affect the SOG film. Besides, the quintuple-structure interlayer insulating film also serves as a level difference compensating film, has a feature of being mechanically stable, and has a high adherence to the pad metal.

Consequently, when an external force is applied to the electrode pad upon bonding or after bonding, the barrier metal tends to hardly peels off the layer beneath. Therefore, the semiconductor device having the area pad structure characterized in structural stability, a low price, high quality, and high reliability can be stably mass-produced.

Fifth Embodiment

The following description will explain a still another embodiment of the present invention, while referring to the drawings. The members having the same structure (function) as those in the first through fourth embodiments will be designated by the same reference numerals and their description will be omitted.

Figure 14:
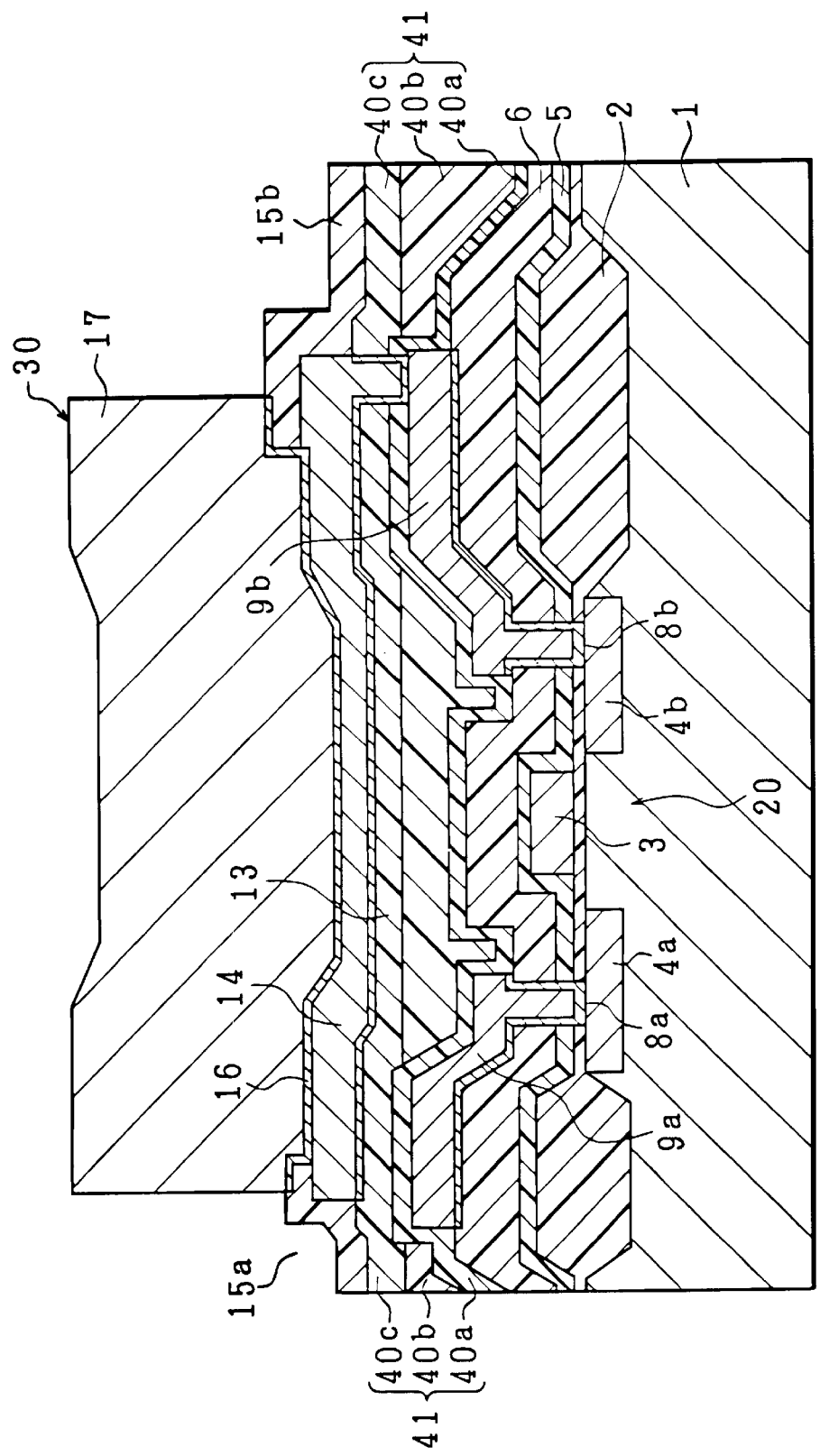
FIG. 14 is a cross-sectional view illustrating an arrangement of semiconductor device in accordance with still another embodiment of the present invention.

As shown in FIG. 14, an interlayer insulating film in the present embodiment, which results on simplifying the quintuple-structure interlayer insulating film 40 of the fourth embodiment, is provided between the second metal layer 14 and the first metal layers 9a and 9b, which interlayer insulating film is a trilaminar interlayer insulating film (hereinafter referred to as a trilaminar insulating film) 41. The arrangement of the present embodiment is identical to that of the fourth embodiment, except that this trilaminar insulating film 41 is provided in lieu of the quintuple-structure insulating film 40.

By omitting, in the process for forming the quintuple-structure insulating film 40 of the fourth embodiment, operations of forming and etching the SOG film as the fourth-layer insulating film 40d shown in FIGS. 12(b) and 12(c) and an operation of forming the silicon nitride film or the silicon oxide film as the fifth-layer insulating film 40e shown in FIG. 12(d), the trilaminar insulating film of the present embodiment is obtained.

Concretely, the trilaminar insulating film 41 of the present embodiment is composed of a first-layer insulating film 40a which is a silicon nitride film or a silicon oxide film, a second-layer insulating film 40b which is an SOG film, and a third-layer insulating film 40c which is a silicon nitride film or a silicon oxide film, like the first-layer insulating film 40a. The second-layer insulating film 40b is formed so as to cover the first-layer insulating film 40a except portions thereof above the first metal layers 9a and 9b. In other words, the trilaminar insulating film 41 has a structure such that, like in the fourth embodiment, the SOG film is provided between silicon nitride or silicon oxide films.

Thus, in the above arrangement, the interlayer insulating film has not a quintuple layer structure but a trilaminar structure, unlike in the fourth embodiment. Therefore, the mechanical stability of the interlayer insulating film may be more or less inferior. However, since the steps of forming and etching the fourth-layer insulating film 40d and the step of forming the fifth-layer insulating film 40e are omitted, the manufacturing process is simplified, thereby allowing the manufacturing costs to lower.

As described above, the semiconductor device of the present invention is arranged so as to have a trilaminar interlayer insulating film between the first metal layers made of aluminum or aluminum alloy and the pad metal.

Therefore, when an external force upon the ILB operation is exerted to the interlayer insulating film through the bump, the external force does not concentratively affect the SOG film, thereby causing the interlayer insulating film to have a stable structure, while simplifying the manufacturing process and lowering the manufacturing costs.

Sixth Embodiment

The following description will explain still another embodiment of the present invention, while referring to the drawings. The members having the same structure (function) as those in the first through fifth embodiments will be designated by the same reference numerals and their description will be omitted.

Figure 15:
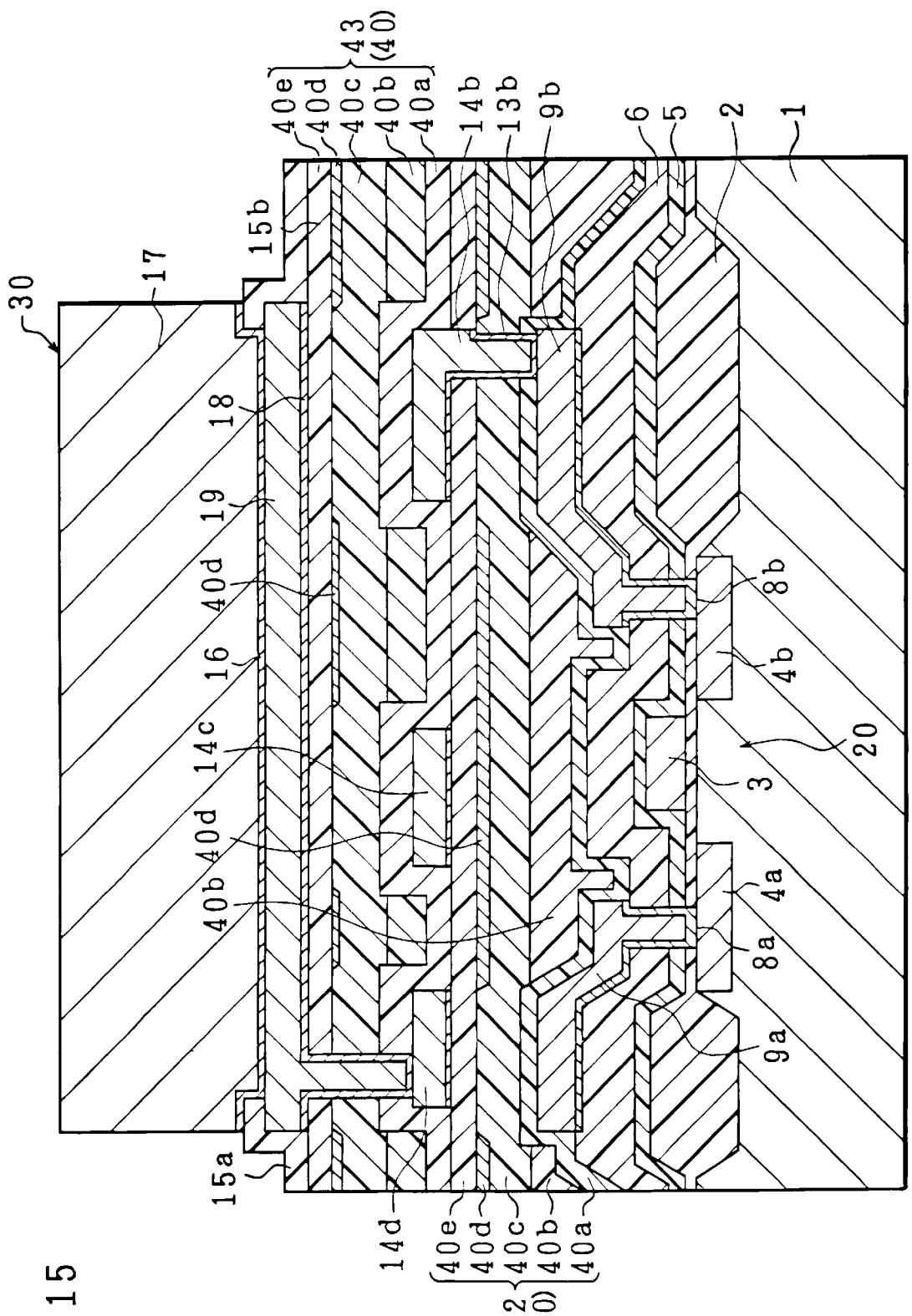
FIG. 15 is a cross-sectional view illustrating an arrangement of a semiconductor device in accordance with still another embodiment of the present invention.

As shown in FIG. 15, the arrangement of the present invention is characterized in that in addition to the two layers of metal wires (the metal wires of the active element and the pad metal), another metal wire is formed between the metal wires, with interlayer insulating films therebetween.

Specifically, second metal layers 14b, 14c, and 14d are additionally formed between the first metal layers 9a and 9b as the metal wires of the active element on one hand and the pad metal (third metal layer 19) as the metal wire of the electrode pad on the other hand. Besides, a pair of quintuple-structure insulating films 40 are formed so as to sandwich the second metal layers 14b, 14c, and 14d.

More specifically, one quintuple-structure insulating film 40 is formed as a lower interlayer insulating film 42, between the first metal layers 9a and 9b and the second metal layers 14b, 14c, and 14d. The first metal layer 9b and the second metal layer 14b are in contact with each other through a contact hole formed in the lower interlayer insulating film 42.

Then, another quintuple-structure insulating film 40 is formed as an upper interlayer insulating film 43, between the second metal layers 14b, 14c, and 14d and the third metal layer 19. The second metal layer 14d and the third metal layer 19 are in contact with each other through a contact hole formed in the upper interlayer insulating film 43.

Since the lower and upper interlayer insulating films 42 and 43 has the same arrangement as that of the quintuple-structure insulating layer 40 of the fourth embodiment described above, detailed description about the arrangement thereof is omitted here, but as to both the lower and upper interlayer insulating films 42 and 43, it is preferable that the SOG film (fourth-layer insulating film 40d) formed between the third-layer insulating film 40c and the fifth-layer insulating film 40e is substantially completely removed by etching. By doing so, an effect of an external force is hardly exerted to the SOG film in a region between the first metal layers 9a and 9b.

As described above, the semiconductor device in accordance with the present invention is characterized in that each metal wire made of aluminum or aluminum alloy has a trilaminar structure, and that quintuple-structure insulating films are formed between metal wires, respectively.

Therefore, with the aforementioned arrangement, an external force upon an ILB operation is prevented from being exerted to the interlayer insulating films even in the case where each metal wire has a multi-layer-structure having not less than two layers, and as a result, the interlayer insulating films have more stable structures.

Seventh Embodiment

The following description will explain still another embodiment of the present invention, while referring to the drawings. The members having the same structure (function) as those in the first through sixth embodiments will be designated by the same reference numerals and their description will be omitted.

Figure 16:
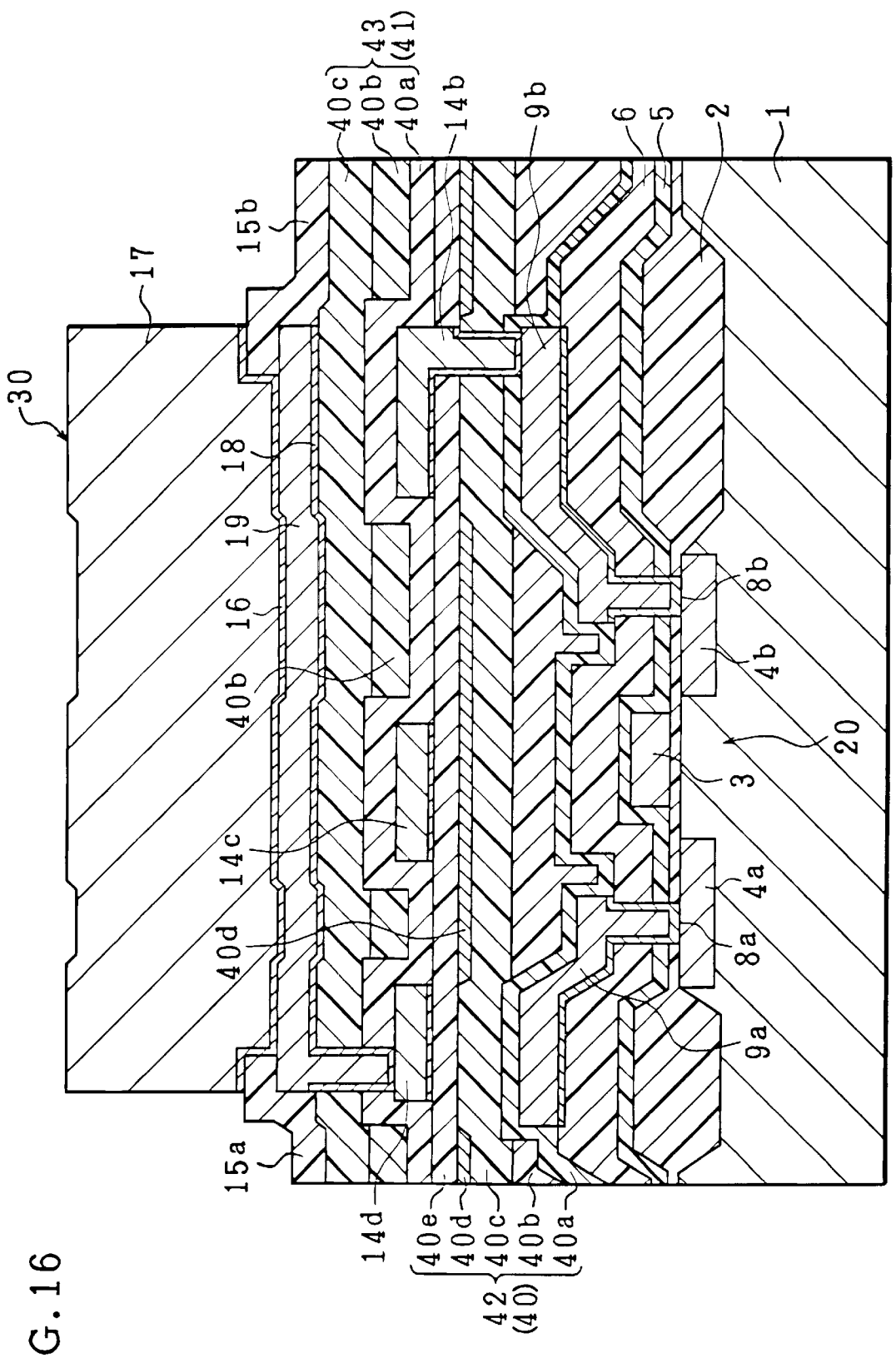
FIG. 16 is a cross-sectional view illustrating another arrangement of the semiconductor device shown in FIG. 15.
Figure 17:
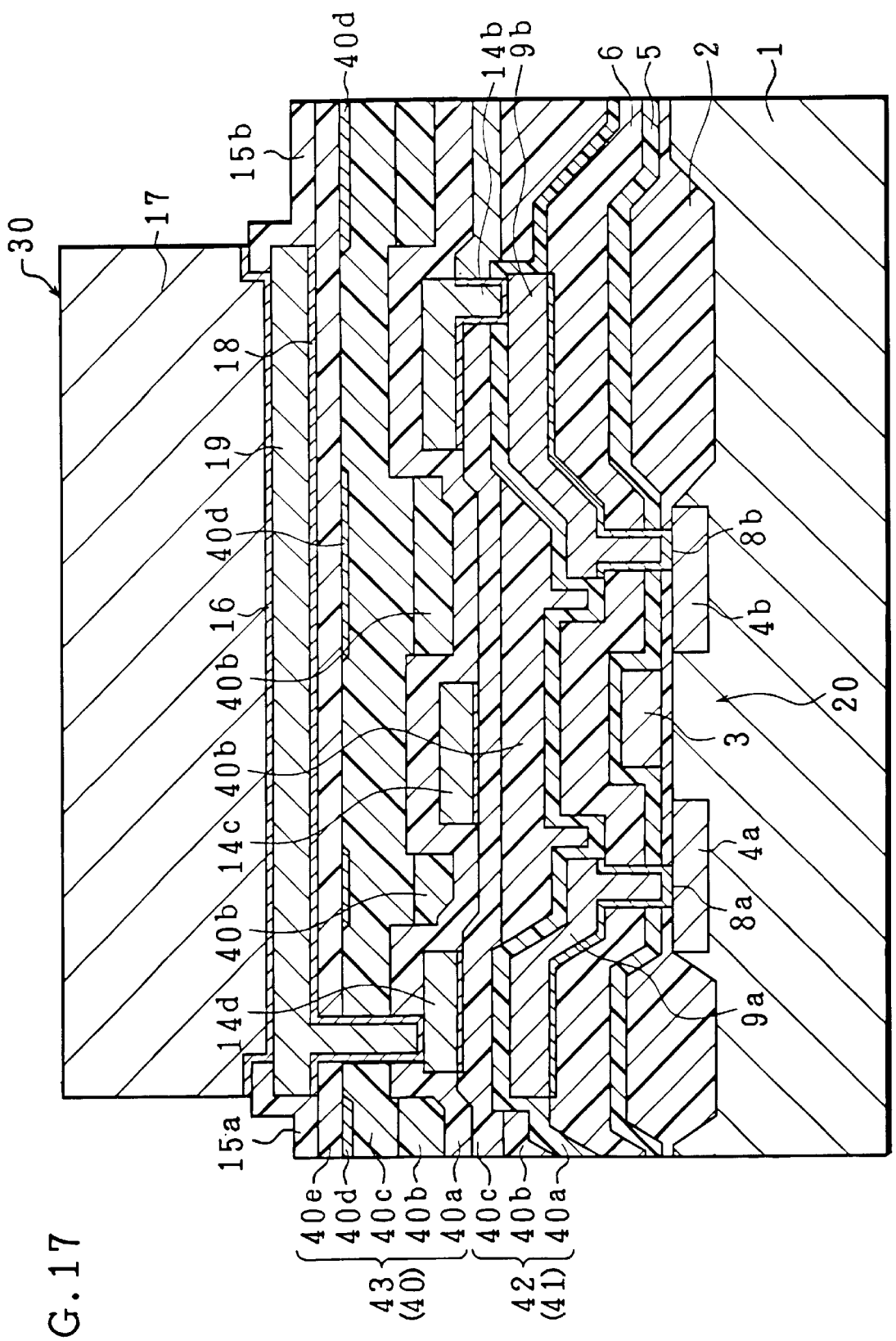
FIG. 17 is a cross-sectional view illustrating still another a arrangement of the semiconductor device shown in FIG. 15.
Figure 18:
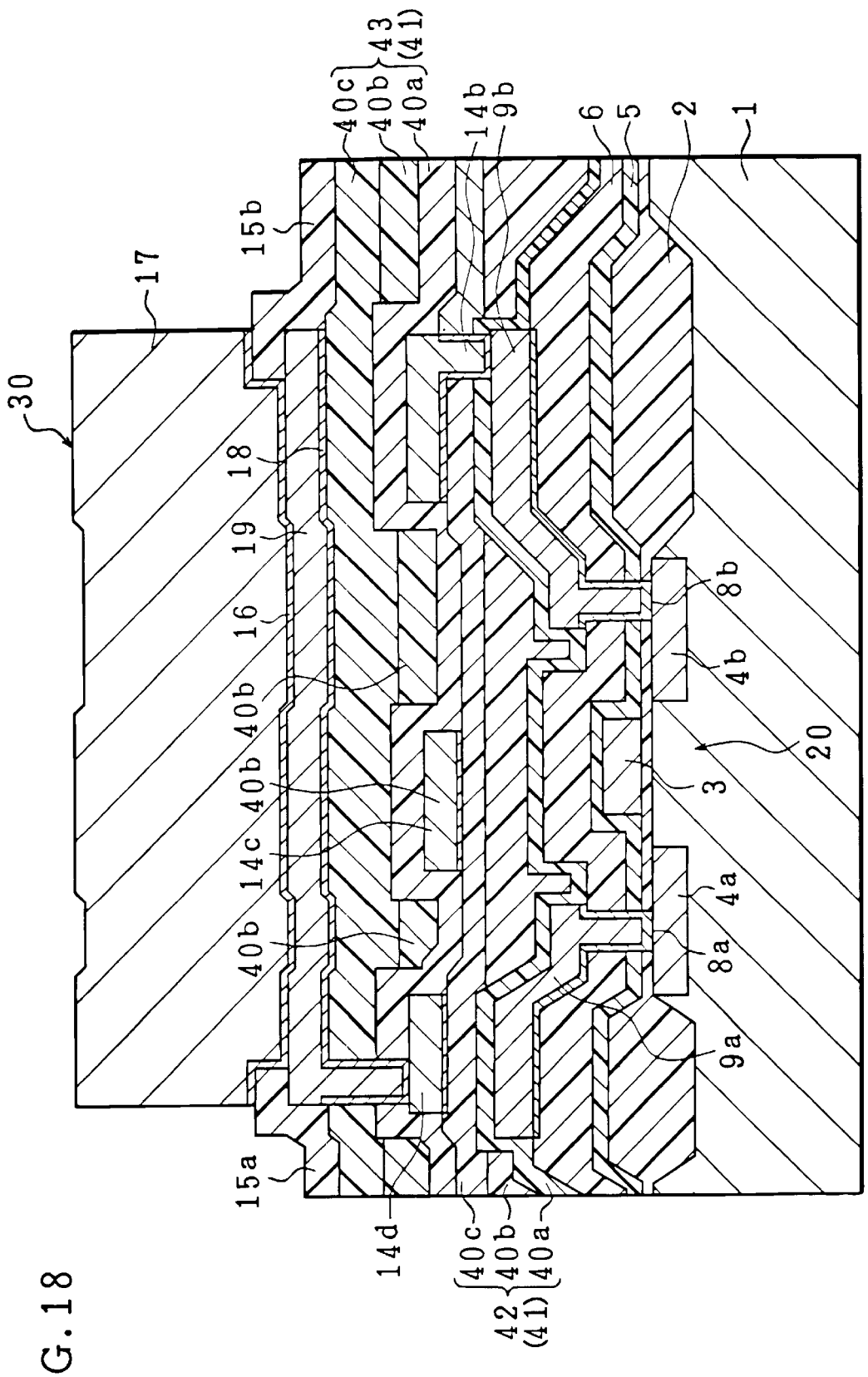
FIG. 18 is a cross-sectional view illustrating still another arrangement of the semiconductor device shown in FIG. 15.
Figure 19:
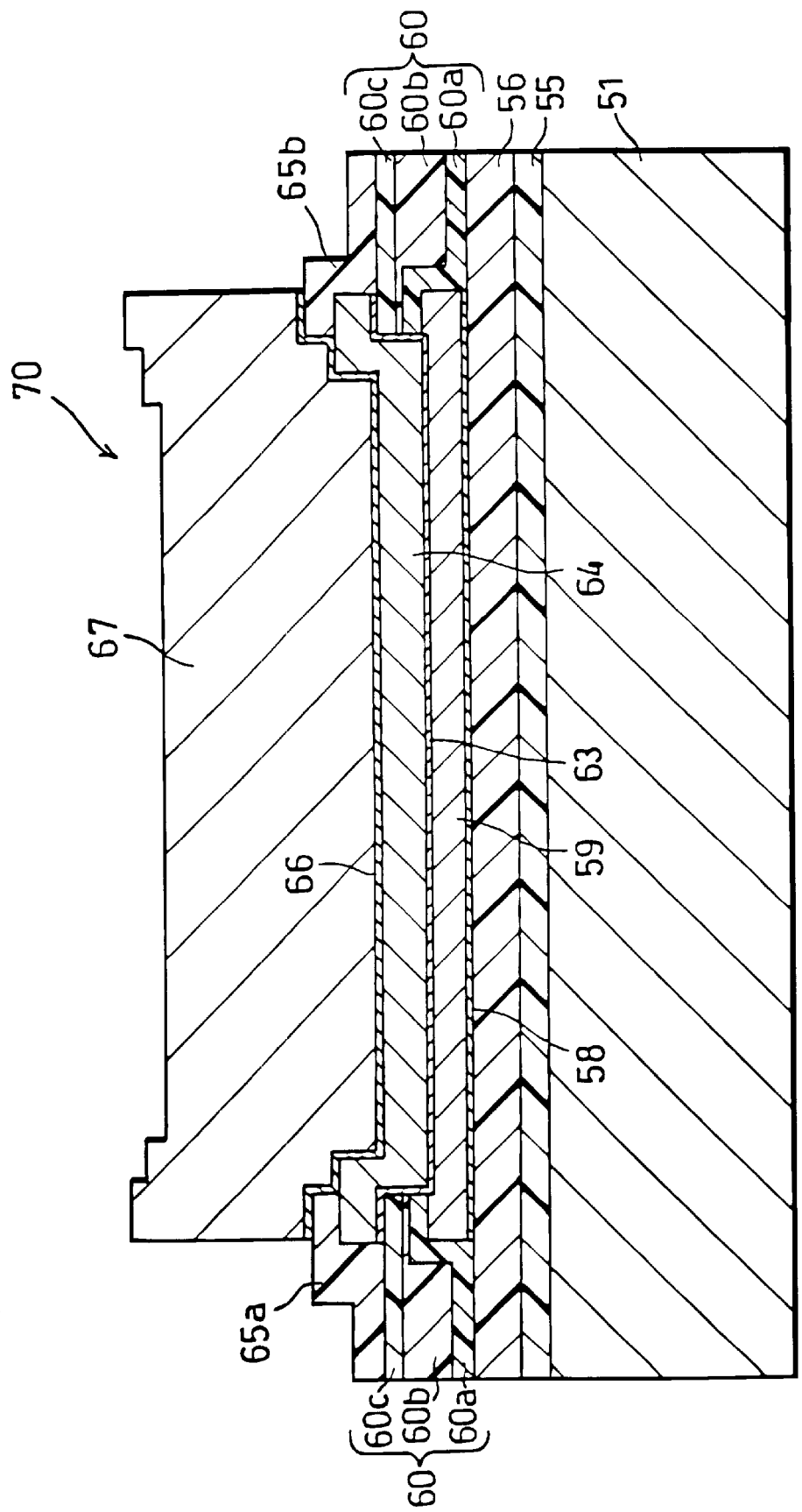
FIG. 19 is a cross-sectional view illustrating an arrangement of a conventional semiconductor device in which an electrode pad is formed on a portion other than an active element.
Figure 20:
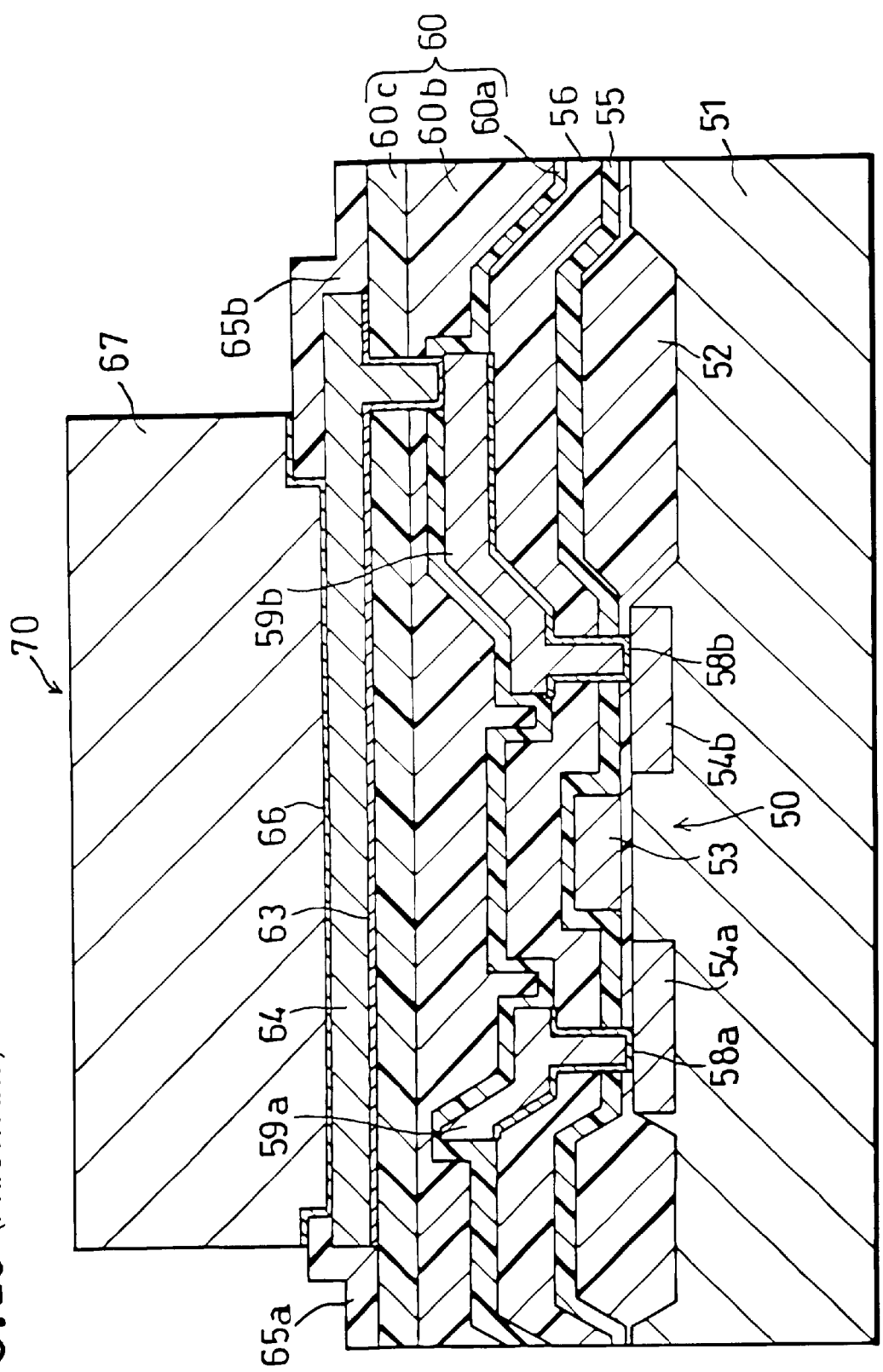
FIG. 20 is a cross-sectional view illustrating an arrangement of a conventional semiconductor device in which an electrode pad is formed on an active element.
Figures 21A, 21B, 21C, 21D:
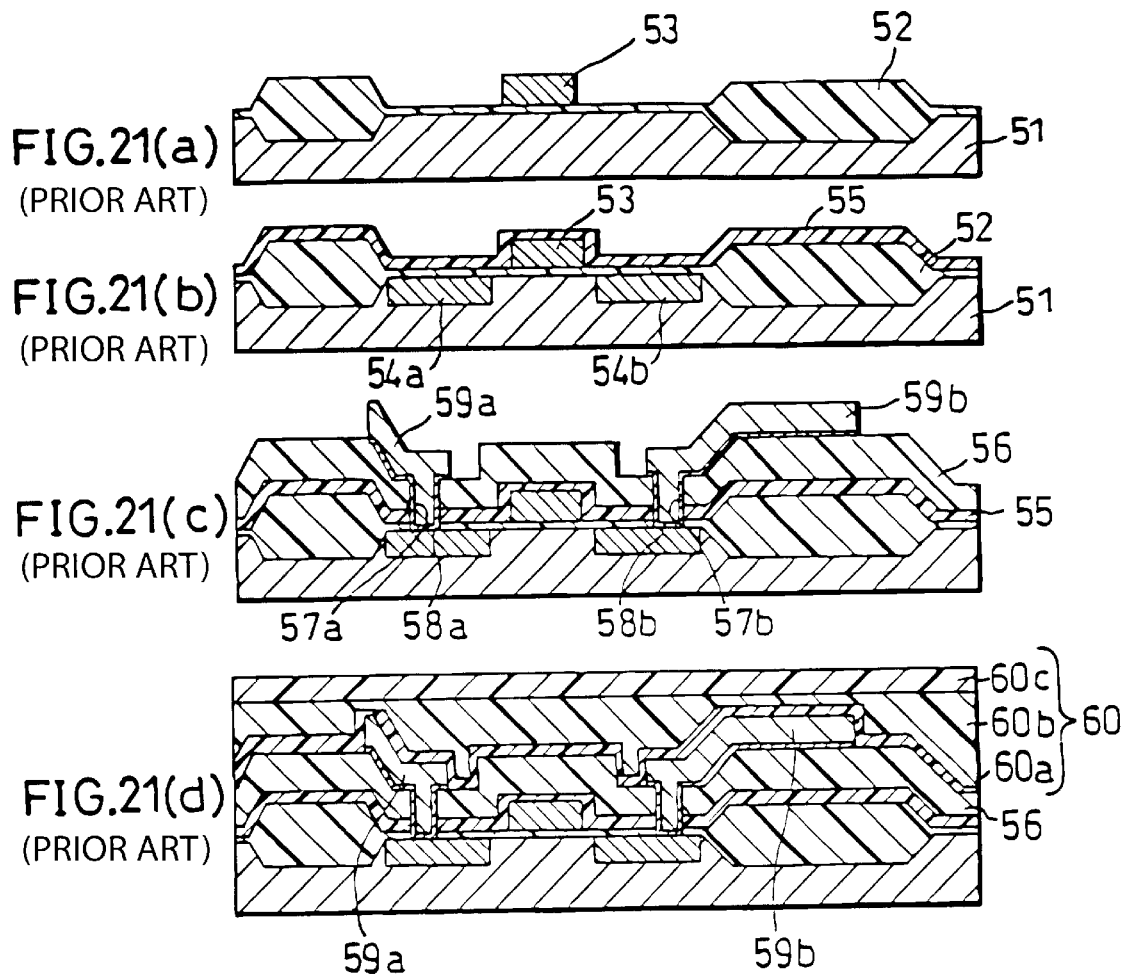
FIGS. 21(a) through 21(d) are cross-sectional views illustrating a manufacturing process of the semiconductor device.
Figure 22:
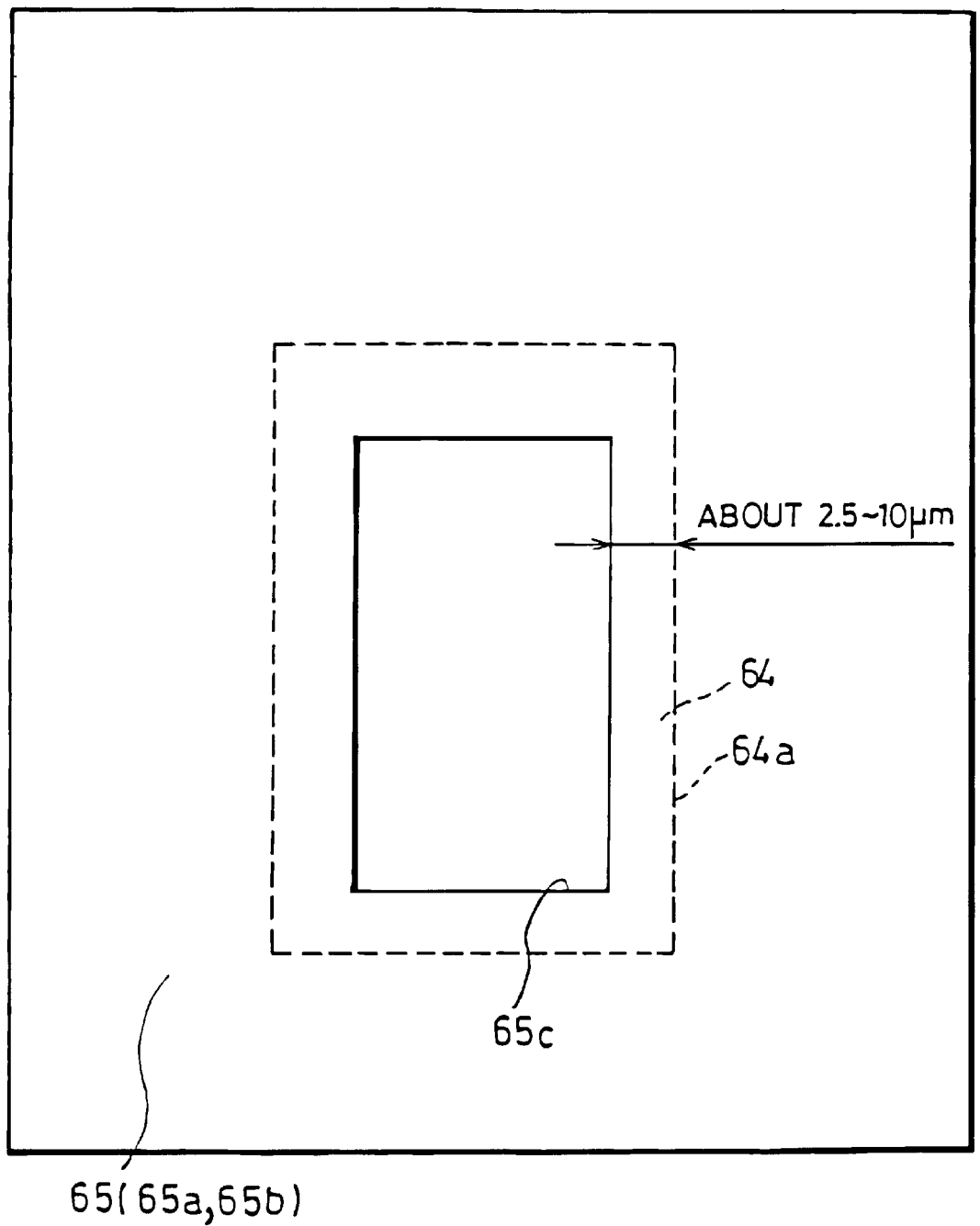
FIG. 22 is a plan view illustrating a lower side of an electrode of the semiconductor device.
Figure 23:
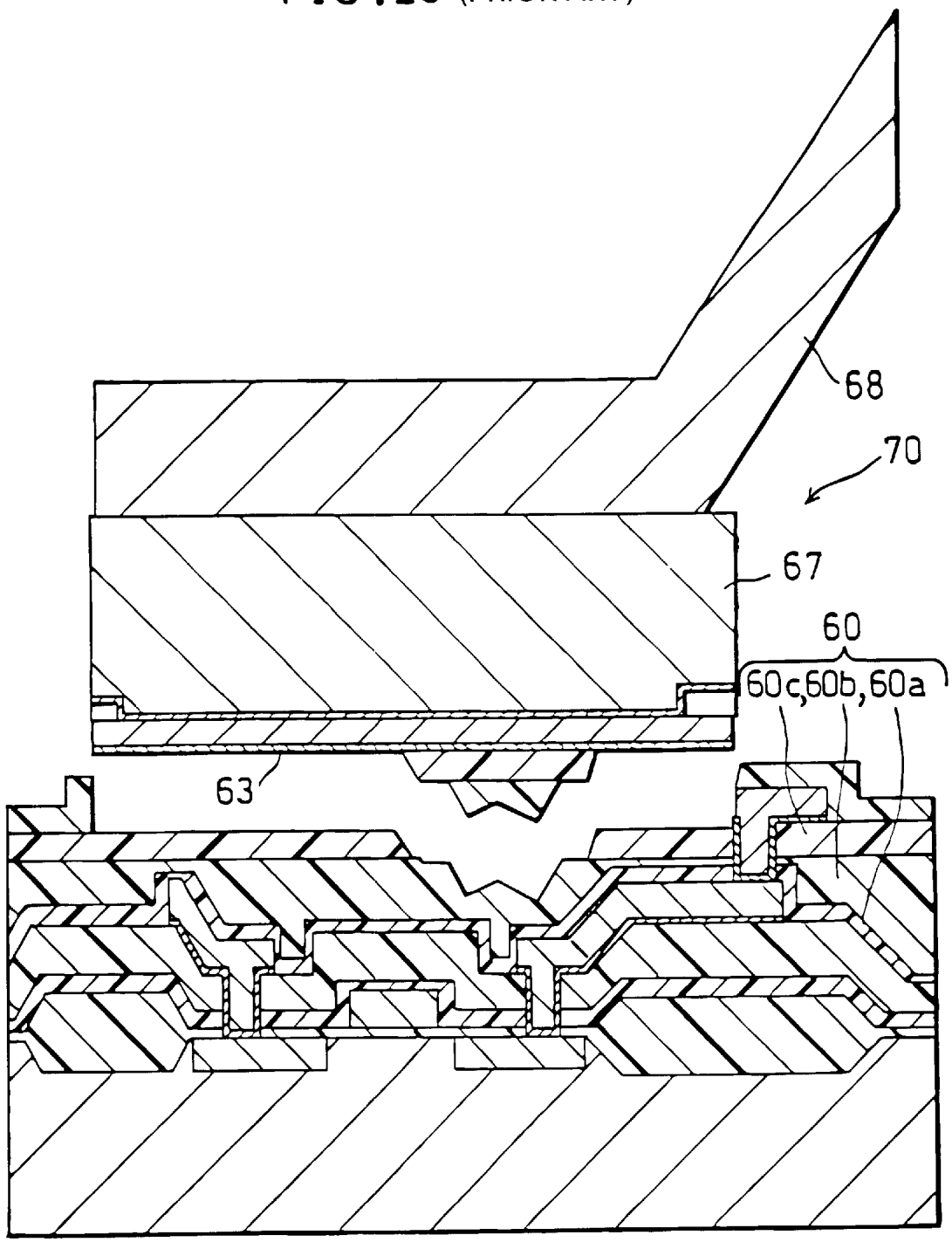
FIG. 23 is a cross-sectional view illustrating a state where an interlayer insulating film is broken, and a barrier metal layer comes off the interlayer insulating film.

As shown in FIGS. 16, 17, and 18, an arrangement of the present embodiment is identical to the sixth embodiment in the following aspects: (1) each metal wire has a trilaminar structure; (2) a lower interlayer insulating film 42 is formed between the first metal layers 9a and 9b and the second metal layers 14b, 14c, and 14d; and (3) an upper interlayer insulating film 43 is formed between the second metal layers 14b, 14c, and 14d and the third metal layer 19. However, in the present embodiment, at least either of the lower and upper interlayer insulating films 42 and 43 is identical to the trilaminar insulating film 41 of the fifth embodiment.

Specifically, the present embodiment has any one of the following arrangements regarding the interlayer insulating films: (1) as shown in FIG. 16, the lower interlayer insulating film 42 is a quintuple-structure insulating film 40, and the upper interlayer insulating film 43 is a trilaminar insulating film 41; (2) as shown in FIG. 17, the lower interlayer insulating film 42 is a trilaminar insulating film 41, and the upper interlayer insulating film 43 is a quintuple-structure insulating film 40; and (3) as shown in FIG. 18, the lower and upper interlayer insulating films 42 and 43 are both trilaminar insulating films 41.

By arranging the lower and upper interlayer insulating films 42 and 43 so that either of them is the trilaminar interlayer insulating film 41, or preferably, so that both of them are the trilaminar interlayer insulating films 41 as described above, it is possible to simplify the manufacturing process and to reduce the manufacturing costs. Besides, in the case where here either of the lower and upper interlayer insulating films 42 and 43 is the quintuple-structure interlayer insulating film 40, it is preferable that the SOG film (the fourth-layer insulating film 40d) formed between the third-layer insulating film 40c and the fifth-layer insulating film 50e is substantially completely removed by etching. By doing so, an effect of an external force is hardly exerted to the SOG film between the first metal layers 9a and 9b.

As described above, the semiconductor device of the present embodiment is characterized in that each metal wire made of aluminum or aluminum alloy has a trilaminar structure, and that at least either of the lower and upper interlayer insulating films is a trilaminar interlayer insulating film.

Therefore, with the aforementioned arrangement, the interlayer insulating films have a more stable structure each, even in the case where each metal wire has a multi-layer-structure having not less than two layers, and as a result, the interlayer insulating films have more stable structures.

It should be noted that though each metal wire has a trilaminar structure in the aforementioned sixth embodiment and the present embodiment, each metal wire may have a structure of more than three layers. In such a case, each interlayer insulating film formed between metal wires preferably has a quintuple layer structure so as to have more positive stability. Alternatively, to simplify the manufacturing process and to reduce the manufacturing costs, at least one of the interlayer insulating films formed between the metal wires respectively is preferably a trilaminar insulating film. In the latter case, needless to say, not less than two interlayer insulating films may have a trilaminar structure each, or all the interlayer insulating films may have a trilaminar structure each.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    an active element provided on a semiconductor substrate;
    an interlayer insulating film formed covering said active element;
    a pad metal for an electrode pad, said pad metal being provided on said interlayer insulating film;
    a barrier metal layer provided on said active element with said interlayer insulating film therebetween, so that said pad metal is provided on said barrier metal layer; and
    a high adherence insulating film having high adherence to said barrier metal layer, said high adherence insulating film being provided between said interlayer insulating film and said barrier metal layer, wherein said high adherence insulating film has a slit for letting gas generated from said interlayer insulating film pass therethrough.

2. A semiconductor device comprising:
    an active element provided on a semiconductor substrate;
    an interlayer insulating film formed covering said active element;
    a pad metal for an electrode pad, said pad metal being provided over and substantially overlying said interlayer insulating film, and said pad metal substantially covering said active element;
    a barrier metal layer provided over said active element with said interlayer insulating film therebetween, so that said pad metal is provided on said barrier metal layer; and
    an insulating film having high adherence to said barrier metal layer, said insulating film being provided between said interlayer insulating film and said barrier metal layer, wherein:
        said interlayer insulating film has at least a level difference compensating film for compensating a level difference of a metal layer formed under said interlayer insulating film; and
        a portion of said level difference compensating film under said pad metal is removed.

3. The semiconductor device as in claim 1 wherein said pad metal is substantially overlying said interlayer insulating film, and said pad metal is substantially covering said active element; and
    said barrier metal layer is provided over said active element.

4. The semiconductor device as set forth in claim 1, wherein said high adherence insulating film is a silicon nitride film.

5. The semiconductor device as set forth in claim 4, wherein the silicon nitride film has a thickness of 200 to 600 nm.

6. The semiconductor device as set forth in claim 1, wherein said high adherence insulating film is one among at least a silicon oxide film, a phospho-silicate glass film, a boron phospho-silicate glass film, and a non-dope silicate glass film.

7. The semiconductor device as set forth in claim 1, wherein said barrier metal layer is a layer made of a titanium chemical compound.

8. The semiconductor device as set forth in claim 1, wherein said barrier metal layer is a titanium-tungsten layer.

9. The semiconductor device as set forth in claim 1, wherein said interlayer insulating film is a trilaminar insulating film having first, second and third layers, the first and third layers being insulating films containing silicon, the second layer being a level difference compensating film.

10. The semiconductor device as set forth in claim 1, wherein said interlayer insulating film is a trilaminar insulating film comprising a first film of silicon nitride, a second film of spin-on glass, and a third film of silicon oxide.

11. The semiconductor device as set forth in claim 1, wherein said interlayer insulating film is a trilaminar insulating film comprising a first film of a tetra ethoxy silane, a second film form of spin-on glass, and a third film of tetra ethoxy silane.

12. The semiconductor device as set forth in claim 2, wherein:
    said level difference compensating film is formed to a minimum thickness necessary for compensating the level difference of said metal layer.

13. The semiconductor device as set forth in claim 1, further comprising a passivation film, said passivation film covering a majority of said pad metal.

14. A semiconductor device, as in claim 1:
    wherein said interlayer insulating film has a trilaminar structure, wherein each of first and third layers thereof being a silicon nitride film or a silicon oxide film, while a second layer thereof being spin-on-glass; and
    the semiconductor device further comprising a metal layer formed on the active element, the second layer in the interlayer insulating film being a minimum thickness necessary for compensating a level difference of the metal layer.

15. A semiconductor device as in claim 3, wherein:
    said pad metal substantially covering said active element; and said high adherence insulating film restricting exfoliation of said barrier metal due to an external force applied upon bonding said electrode pad, said high adherence insulating film being substantially covered by a pad metal.

16. The semiconductor device as set forth in claim 15, wherein said active element includes at least two diffusion layers and a gate electrode.

* * * * *

UNITED STATES PATENT AND TRADEMARK OFFICE
CERTIFICATE OF CORRECTION

PATENT NO.    : 6,650,002 B1
DATED         : November 18, 2003
INVENTOR(S)   : Toyosawa et al.

It is certified that error appears in the above-identified patent and that said Letters Patent is hereby corrected as shown below:

<u>Title page,</u>
Item [73], Assignee, delete "Kaishi" and insert -- Kaisha --.

Signed and Sealed this

Third Day of February, 2004

JON W. DUDAS
*Acting Director of the United States Patent and Trademark Office*